United States Patent
Aihara

(10) Patent No.: US 9,299,885 B2
(45) Date of Patent: Mar. 29, 2016

(54) LIGHT-EMITTING DIODE, LIGHT-EMITTING DIODE LAMP, AND ILLUMINATION DEVICE

(75) Inventor: Noriyuki Aihara, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 13/990,653

(22) PCT Filed: Nov. 30, 2011

(86) PCT No.: PCT/JP2011/077632
§ 371 (c)(1),
(2), (4) Date: May 30, 2013

(87) PCT Pub. No.: WO2012/073993
PCT Pub. Date: Jun. 7, 2012

(65) Prior Publication Data
US 2013/0248819 A1    Sep. 26, 2013

(30) Foreign Application Priority Data

Dec. 2, 2010   (JP) ................. 2010-269709

(51) Int. Cl.
*H01L 29/06*   (2006.01)
*H01L 21/00*   (2006.01)
(Continued)

(52) U.S. Cl.
CPC .............. *H01L 33/06* (2013.01); *H01L 33/325* (2013.01); *H01L 33/20* (2013.01); *H01L 33/38* (2013.01);
(Continued)

(58) Field of Classification Search
CPC ....... H01L 33/06; H01L 33/325; H01L 33/20; H01L 33/38; H01L 27/14; H01L 27/15
USPC .............. 257/13, E33.067; 438/31
See application file for complete search history.

(56) References Cited

U.S. PATENT DOCUMENTS

| 5,545,903 A | 8/1996 | Van Der Poel et al. |
| 7,879,628 B2 * | 2/2011 | Asatsuma ............ H01S 5/10 438/22 |

(Continued)

FOREIGN PATENT DOCUMENTS

| CN | 1099906 A | 3/1995 |
| CN | 101310392 A | 11/2008 |

(Continued)

OTHER PUBLICATIONS
Communication dated May 14, 2014 from the Korean Patent Office in counterpart Korean Patent Application No. 10-2013-7014469.
(Continued)

*Primary Examiner* — Julio J Maldonado
*Assistant Examiner* — Moazzam Hossain
(74) *Attorney, Agent, or Firm* — Sughrue Mion, PLLC

(57) ABSTRACT

The invention provides a light-emitting diode, a light-emitting diode lamp, and an illumination device which emit infrared light with both high-speed response and high output performance. The invention relates to a light-emitting diode including a light-emitting portion which has an active layer of a quantum well structure, in which a well layer made of a compound semiconductor having a composition formula $(In_{X1}Ga_{1-X1})As$ ($0 \leq X1 \leq 1$) and a barrier layer made of a compound semiconductor having a composition formula $(Al_{X2}Ga_{1-X2})As$ ($0 \leq X2 \leq 1$) are alternately laminated, and a first clad layer and a second clad layer sandwiching the active layer, an electric current diffusion layer which is formed on the light-emitting portion, and a functional substrate which is bonded to the electric current diffusion layer, a light-emitting diode lamp, and an illumination device. The first and second clad layers are made of a compound semiconductor having a composition formula $(Al_{X3}Ga_{1-X3})_{Y1}In_{1-Y1}P$ ($0 \leq X3 \leq 1$, $0 < Y1 \leq 1$), and when a single well layer and a single barrier layer form a single paired layer, the number of paired layers is equal to or smaller than 5.

22 Claims, 11 Drawing Sheets

(51) Int. Cl.
*H01L 33/06* (2010.01)
*H01L 33/32* (2010.01)
*H01L 33/20* (2010.01)
*H01L 33/38* (2010.01)

(52) U.S. Cl.
CPC ............... *H01L 2224/45144* (2013.01); *H01L 2224/48091* (2013.01); *H01L 2224/48227* (2013.01); *H01L 2924/12032* (2013.01)

(56) References Cited

U.S. PATENT DOCUMENTS

| | | | |
|---|---|---|---|
| 2004/0066818 A1* | 4/2004 | Yamamoto et al. | 372/45 |
| 2005/0087734 A1* | 4/2005 | Yabuki | 257/13 |
| 2005/0145857 A1* | 7/2005 | Maruyama et al. | 257/79 |
| 2006/0007974 A1* | 1/2006 | Tandon et al. | 372/45.01 |
| 2006/0043392 A1 | 3/2006 | Kurahashi et al. | |
| 2007/0076775 A1* | 4/2007 | Bessho et al. | 372/50.121 |
| 2007/0231963 A1* | 10/2007 | Doan et al. | 438/107 |
| 2007/0262335 A1* | 11/2007 | Kumei et al. | 257/98 |
| 2009/0180508 A1* | 7/2009 | Makita | B82Y 20/00 372/45.01 |
| 2009/0206359 A1* | 8/2009 | Nabekura | 257/103 |
| 2012/0168717 A1* | 7/2012 | Aihara | H01L 33/06 257/13 |
| 2014/0016659 A1* | 1/2014 | Liu | H01L 21/02381 372/45.012 |
| 2014/0133505 A1* | 5/2014 | Lindberg | H01S 5/0425 372/44.01 |
| 2014/0247853 A1* | 9/2014 | Deppe | H01S 5/18308 372/50.11 |

FOREIGN PATENT DOCUMENTS

| | | |
|---|---|---|
| CN | 101371372 A | 2/2009 |
| CN | 102428580 A | 4/2012 |
| CN | 102468387 A | 5/2012 |
| CN | 102598318 A | 7/2012 |
| CN | 102598319 A | 7/2012 |
| CN | 102725870 A | 10/2012 |
| CN | 102725871 A | 10/2012 |
| CN | 103081135 A | 5/2013 |
| JP | 5-13884 A | 1/1993 |
| JP | 6-21507 A | 1/1994 |
| JP | 7-38148 A | 2/1995 |
| JP | 2000-101132 A | 4/2000 |
| JP | 2001-274454 A | 10/2001 |
| JP | 2002-26377 A | 1/2002 |
| JP | 2002-111048 A | 4/2002 |
| JP | 2002-344013 A | 11/2002 |
| JP | 2003-258294 A | 9/2003 |
| JP | 2003-338637 A | 11/2003 |
| JP | 2004-88054 A | 3/2004 |
| JP | 2004-128340 A | 4/2004 |
| JP | 2004-146498 A | 5/2004 |
| JP | 2004207508 A | 7/2004 |
| JP | 2005-159297 A | 6/2005 |
| JP | 2006-190792 A | 7/2006 |
| JP | 2006-261266 A | 9/2006 |
| JP | 2007-12688 A | 1/2007 |
| JP | 2007194536 A | 8/2007 |
| JP | 2008-192790 A | 8/2008 |
| JP | 2009-206265 A | 9/2009 |
| WO | 2008151255 A1 | 12/2008 |
| WO | 2010/095361 A1 | 8/2010 |

OTHER PUBLICATIONS

International Search Report for PCT/JP2011/077632 dated Jan. 17, 2012.

Communication dated May 5, 2015, issued by the State Intellectual Property Office of the People's Republic of China in counterpart Application No. 201180058299.0.

* cited by examiner

LIGHT-EMITTING DIODE, LIGHT-EMITTING DIODE LAMP, AND ILLUMINATION DEVICE

CROSS REFERENCE TO RELATED APPLICATIONS

This application is a National Stage of International Application No. PCT/JP2011/077632 filed Nov. 30, 2011, claiming priority based on Japanese Patent Application No. 2010-269709, filed Dec. 2, 2010, the contents of all of which are incorporated herein by reference in their entirety.

TECHNICAL FIELD

The present invention relates to a light-emitting diode, a light-emitting diode lamp, and an illumination device, and in particular, to a light-emitting diode, a light-emitting diode lamp, and an illumination device which emit infrared light with high-speed response and high output performance.

BACKGROUND ART

A light-emitting diode which emits red light or infrared light is used for various purposes, such as communication, various sensors, night illumination, and a light source for a plant factory.

Accordingly, the need for a light-emitting diode emitting infrared light changes from a light-emitting diode which is primarily focused on high output performance or a light-emitting diode which is primarily focused on high-speed response to a light-emitting diode which is focused on both high output performance and high-speed response. In particular, in a light-emitting diode for communication, since a large volume of optical space transmission is performed, high-speed response and high output performance are indispensable.

As a light-emitting diode which emits red light and infrared light, a light-emitting diode is known in which a compound semiconductor layer including an AlGaAs active layer is grown on a GaAs substrate by a liquid phase epitaxial method (for example, Patent Documents 1 to 4).

Patent Document 4 discloses a so-called substrate-removed light-emitting diode in which a compound semiconductor layer including an AlGaAs active layer is grown on a GaAs substrate by a liquid phase epitaxial method, and the GaAs substrate used as a growth substrate is removed. In the light-emitting diode disclosed in Patent Document 4, when the response speed (rising time) is about 40 to 55 nsec, the output is equal to or smaller than 4 mW. When the response speed is about 20 nsec, the output slightly exceeds 5 mW, and as a light-emitting diode which is manufactured using the liquid phase epitaxial method, high output is obtained at the highest response speed.

As an infrared light-emitting diode which has a high light-emission peak wavelength equal to or greater than 900 nm, an infrared light-emitting diode which uses an InGaAs active layer is known (Patent Documents 5 to 7).

DOCUMENTS OF RELATED ART

Patent Literature

[Patent Document 1] Japanese Unexamined Patent Application, First Publication No. Hei 6-21507
[Patent Document 2] Japanese Unexamined Patent Application, First Publication No. 2001-274454
[Patent Document 3] Japanese Unexamined Patent Application, First Publication No. Hei 7-38148
[Patent Document 4] Japanese Unexamined Patent Application, First Publication No. 2006-190792
[Patent Document 5] Japanese Unexamined Patent Application, First Publication No. 2002-26377
[Patent Document 6] Japanese Unexamined Patent Application, First Publication No. 2002-111048
[Patent Document 7] Japanese Unexamined Patent Application, First Publication No. 2002-344013

SUMMARY OF INVENTION

Technical Problem

However, the output of the related art is not sufficient as a light-emitting diode for communication.

Unlike a semiconductor laser, since a light-emitting diode uses spontaneously emitted light, high-speed response and high output performance are in a trade-off relationship. Accordingly, for example, even if the thickness of a light-emitting layer is merely reduced to increase a carrier confinement effect, to increase a light-emission recombination probability of electrons and holes, and to achieve high-speed response, there is a problem in that the emission output is degraded.

As an infrared light-emitting diode which can have a high light-emission peak wavelength equal to or greater than 900 nm, a light-emitting diode which uses an active layer including a well layer made of InGaAs has been put into practical use.

In regard to the light-emitting diode including the InGaAs well layer, it is desirable to develop a light-emitting diode having higher emission efficiency from the viewpoint of further performance enhancement, energy saving, costs, and the like.

The invention has been accomplished in consideration of the above-described situation, and an object of the invention is to provide a light-emitting diode, a light-emitting diode lamp, and an illumination device which emit infrared light with both high-speed response and high output performance.

Solution to Problem

The inventors have conducted many studies so as to solve the above-described problem, and have accomplished a light-emitting diode which emits infrared light with high output while maintaining high-speed response. In this light-emitting diode, an active layer has a quantum well structure in which a ternary mixed crystal well layer made of InGaAs and a ternary mixed crystal barrier layer made of AlGaAs are alternately laminated in five paired layers or less, clad layers which sandwich the active layer are made of quarternary mixed crystal AlGaInP, a compound semiconductor layer including the active layer and the clad layers is epitaxially grown on a growth substrate, the growth substrate is then removed, and the compound semiconductor layer is attached (bonded) to a transparent substrate again.

In addition, the inventors have accomplished a light-emitting diode which emits infrared light with high output while maintaining high-speed response. In this light-emitting diode, an active layer has a quantum well structure in which a ternary mixed crystal well layer made of InGaAs and a quarternary mixed crystal barrier layer made of AlGaInP are alternately laminated in five paired layers or less, clad layers which sandwich the active layer are made of quarternary mixed crystal AlGaInP, and a compound semiconductor layer including the active layer and the clad layers is epitaxially grown on a growth substrate, the growth substrate is then removed, and the compound semiconductor layer is attached (bonded) to a transparent substrate again.

At this time, the inventors have first introduced a quantum well structure, which has a high carrier confinement effect and is suitable for high-speed response, as an active layer, and have set the number of paired layers of the well layer and the barrier layer to be equal to or smaller than five so as to secure high injection carrier density. With this configuration, a response speed which is equal to or higher than the highest response speed of the light-emitting diode manufactured using the liquid phase epitaxial method has been realized.

As the clad layers which sandwich the ternary mixed crystal quantum well structure or the quantum well structure having the ternary mixed crystal well layer and the quarternary mixed crystal barrier layer, quarternary mixed crystal AlGaInP which has a large band gap, is transparent to a light-emission wavelength, and is excellent in crystallinity because As, which is likely to cause defects, is not contained has been introduced.

In the related art, in an infrared light-emitting diode which uses an InGaAs-based active layer, a compound semiconductor layer including the active layer is not attached (bonded) to a transparent substrate, and a GaAs substrate on which a compound semiconductor layer is grown is used directly. However, the GaAs substrate is heavily doped so as to increase conductivity, and inevitably undergoes absorption of light by carriers. Accordingly, a type in which the GaAs substrate as the growth substrate is removed after the growth of the compound semiconductor layer, and the compound semiconductor layer is attached (bonded) to the transparent substrate, thereby avoiding absorption of light by carriers and expecting high output and high efficiency has been introduced.

As described above, the inventors have introduced a configuration in which the quantum well structure of the five paired layers or less functions as the active layer so as to secure high-speed response. In this configuration, an innovative combination in which quarternary mixed crystal is used as the clad layers sandwiching the ternary mixed crystal or ternary-quarternary quantum well structure in this configuration has been introduced, the growth substrate used for the growth of the compound semiconductor layer has been removed, and a configuration in which the compound semiconductor layer has been attached again to a substrate with no light absorption has been introduced, thereby succeeding in high output performance.

The invention provides the following means.

(1) A light-emitting diode including a light-emitting portion which has an active layer of a quantum well structure, in which a well layer made of a compound semiconductor having a composition formula $(In_{X1}Ga_{1-X1})As$ ($0 \leq X1 \leq 1$) and a barrier layer made of a compound semiconductor having a composition formula $(Al_{X2}Ga_{1-X2})As$ ($0 \leq X2 \leq 1$) are alternately laminated, and a first clad layer and a second clad layer sandwiching the active layer, an electric current diffusion layer which is formed on the light-emitting portion, and a functional substrate which is bonded to the electric current diffusion layer, wherein the first and second clad layers are made of a compound semiconductor having a composition formula $(Al_{X3}Ga_{1-X3})_{Y1}In_{1-Y1}P$ ($0 \leq X3 \leq 1$, $0 < Y1 \leq 1$), and the number of paired layers of the well layer and the barrier layer is equal to or smaller than 5.

(2) A light-emitting diode including a light-emitting portion which has an active layer of a quantum well structure, in which a well layer made of a compound semiconductor having a composition formula $(In_{X1}Ga_{1-X1})As$ ($0 \leq X1 \leq 1$) and a barrier layer made of a compound semiconductor having a composition formula $(Al_{X4}Ga_{1-X4})_{Y2}In_{1-Y2}P$ ($0 \leq X4 \leq 1$, $0 < Y2 \leq 1$) are alternately laminated, and a first clad layer and a second clad layer sandwiching the active layer, an electric current diffusion layer which is formed on the light-emitting portion, and a functional substrate which is bonded to the electric current diffusion layer, wherein the first and second clad layers are made of a compound semiconductor having a composition formula $(Al_{X5}Ga_{1-X5})_{Y3}In_{1-Y3}P$ ($0 \leq X5 \leq 1$, $0 < Y3 \leq 1$), and the number of paired layers of the well layer and the barrier layer is equal to or smaller than 5.

(3) The light-emitting diode described in (1) or (2), wherein the bonded area of the active layer and the clad layer is 20,000 to 90,000 $\mu m^2$.

When the active layer and the clad layer are bonded together through a guide layer or the like, the term "bonded area of active layer and clad layer" includes the bonded area of this layer and the active layer or the clad layer.

(4) The light-emitting diode described in any one of (1) to (3), wherein the In composition X1 of the well layer is $0 \leq X1 \leq 0.3$, and the thickness of the well layer is 3 to 10 nm.

(5) The light-emitting diode described in any one of (1) to (3), wherein the In composition X1 of the well layer is $0.1 \leq X1 \leq 0.3$.

(6) The light-emitting diode described in any one of (1) to (5), wherein the functional substrate is transparent to a light-emission wavelength.

(7) The light-emitting diode described in any one of (1) to (6), wherein the functional substrate is made of GaP, sapphire, or SiC.

(8) A light-emitting diode including a light-emitting portion which has an active layer of a quantum well structure, in which a well layer made of a compound semiconductor having a composition formula $(In_{X1}Ga_{1-X1})As$ ($0 \leq X1 \leq 1$) and a barrier layer made of a compound semiconductor having a composition formula $(Al_{X2}Ga_{1-X2})As$ ($0 \leq X2 \leq 1$) are alternately laminated, and a first clad layer and a second clad layer sandwiching the active layer, an electric current diffusion layer which is formed on the light-emitting portion, and a functional substrate which includes a reflecting layer arranged to face the light-emitting portion and having reflectance equal to or greater than 90% with respect to a light-emission wavelength, and is bonded to the electric current diffusion layer, wherein the first and second clad layers are made of a compound semiconductor having a composition formula $(Al_{X3}Ga_{1-X3})_{Y1}In_{1-Y1}P$ ($0 \leq X3 \leq 1$, $0 < Y1 \leq 1$), and the number of paired layers of the well layer and the barrier layer is equal to or smaller than 5.

(9) A light-emitting diode including a light-emitting portion which has an active layer of a quantum well structure, in which a well layer made of a compound semiconductor having a composition formula $(In_{X1}Ga_{1-X1})As$ ($0 \leq X1 \leq 1$) and a barrier layer made of a compound semiconductor having a composition formula $(Al_{X4}Ga_{1-X4})_{Y2}In_{1-Y2}P$ ($0 \leq X4 \leq 1$, $0 < Y2 \leq 1$) are alternately laminated, and a first clad layer and a second clad layer sandwiching the active layer, an electric current diffusion layer which is formed on the light-emitting portion, and a functional substrate which includes a reflecting layer arranged to face the light-emitting portion and having reflectance equal to or greater than 90% with respect to a light-emission wavelength, and is bonded to the electric current diffusion layer, wherein the first and second clad layers are made of a compound semiconductor having a composition formula $(Al_{X5}Ga_{1-X5})_{Y3}In_{1-Y3}P$ ($0 \leq X5 \leq 1$, $0 < Y3 \leq 1$), and the number of paired layers of the well layer and the barrier layer is equal to or smaller than 5.

(10) The light-emitting diode described in (8) or (9), wherein the bonded area of the active layer and the clad layer is 20,000 to 90,000 µm².

(11) The light-emitting diode described in any one of (8) to (10), wherein the In composition X1 of the well layer is 0≤X1≤0.3, and the thickness of the well layer is 3 to 10 nm.

(12) The light-emitting diode described in any one of (8) to (10), wherein the In composition X1 of the well layer is 0.1≤X1≤0.3.

(13) The light-emitting diode described in any one of (8) to (12), wherein the functional substrate includes a layer which is made of silicon or germanium.

(14) The light-emitting diode described in any one of (8) to (12), wherein the functional substrate includes a metal substrate.

(15) The light-emitting diode described in (14), wherein the metal substrate has two metal layers or more.

(16) The light-emitting diode described in any one of (1) to (15), wherein the number of paired layers of the well layer and the barrier layer is equal to or smaller than 3.

(17) The light-emitting diode described in any one of (1) to (16), wherein the electric current diffusion layer is made of GaP.

(18) The light-emitting diode described in any one of (1) to (17), wherein the thickness of the electric current diffusion layer is in a range of 0.5 to 20 µm.

(19) The light-emitting diode described in any one of (1) to (18), wherein the lateral surface of the functional substrate has a vertical surface perpendicular to a principal light extraction surface on a side near the light-emitting portion, and has an inclined surface inwardly inclined with respect to the principal light extraction surface on a side away from the light-emitting portion.

(20) The light-emitting diode described in (19), wherein the inclined surface includes a rough surface.

(21) The light-emitting diode described in (19) or (20), wherein a first electrode and a second electrode are provided on the principal light extraction surface side of the light-emitting diode.

(22) The light-emitting diode described in (21), wherein the first electrode and the second electrode are ohmic electrodes.

(23) A light-emitting diode lamp including the light-emitting diode described in any one of (1) to (22).

(24) An illumination device having mounted therein two or more of at least one of the light-emitting diode described in any one of (1) to (22) and the light-emitting diode lamp described in (23).

In the invention, although the term "functional substrate" refers to a substrate which is bonded to the compound semiconductor layer through the electric current diffusion layer to support the compound semiconductor layer after the compound semiconductor layer is grown on the growth substrate and the growth substrate is removed, when a predetermined layer is formed on the electric current diffusion layer, and a predetermined substrate is then bonded onto the predetermined layer, the predetermined substrate including the predetermined layer is referred to as a "functional substrate".

Advantageous Effects of Invention

According to the light-emitting diode of the invention, the active layer of the quantum well structure in which the well layer made of ternary mixed crystal InGaAs and the barrier layer made of ternary mixed crystal AlGaAs are alternately laminated is introduced, and the quantum well structure having a large injected carrier confinement effect is used. Accordingly, sufficient injected carriers are confined in the well layer, whereby the carrier density in the well layer increases. As a result, a light-emission recombination probability increases, resulting in the improvement of the response speed.

Although the carriers injected into the quantum well structure expand over the well layer in the quantum well structure by a tunnel effect due to fluctuation, since a configuration in which the number of paired layers of the well layer and the barrier layer in the quantum well structure is equal to or smaller than 5 is introduced, degradation in the injected carrier confinement effect due to the expansion is avoided as much as possible, and high-speed response is secured.

Since light is emitted from the active layer of the quantum well structure, monochromaticity is high.

According to the light-emitting diode of the invention, a configuration in which the active layer of the ternary-quaternary quantum well structure, in which the well layer made of ternary mixed crystal InGaAs and the barrier layer made of quarternary mixed crystal AlGaInP are alternately laminated, is introduced, and the quantum well structure having a large injected carrier confinement effect is used can be made.

A configuration in which the first clad layer and the second clad layer sandwiching the active layer are made of AlGaInP which is transparent to the light-emission wavelength and has high crystallinity because As, which is likely to cause defects, is not contained is introduced, whereby a non-light-emission recombination probability of electrons and holes through defects is degraded, and the light-emission output is improved.

A configuration in which the first clad layer and the second clad layer sandwiching the active layer are made of quarternary mixed crystal AlGaInP is introduced, whereby Al concentration is low and moisture resistance is improved compared to a light-emitting diode in which a barrier layer and clad layers are made of ternary mixed crystal.

Since a configuration in which the growth substrate of the compound semiconductor layer is removed and the functional substrate is bonded to the electric current diffusion layer is introduced, absorption of light by the growth substrate is avoided, and the light-emission output is improved. That is, since a GaAs substrate which is usually used as the growth substrate of the compound semiconductor layer has a band gap smaller than the band gap of the active layer, light from the active layer is absorbed by the GaAs substrate, and light extraction efficiency is degraded. Meanwhile, the GaAs substrate is removed, whereby the light-emission output is improved.

According to the light-emitting diode of the invention, a configuration in which the bonded area of the active layer and the clad layer is 20,000 to 90,000 µm² is introduced. In this way, the bonded area is equal to or smaller than 90,000 µm², whereby current density increases, high output is secured, the light-emission recombination probability increases, and the response speed is improved. Meanwhile, the bonded area is equal to or greater than 20,000 µm², the saturation of the light-emission output with respect to a flowing current is suppressed, whereby there is little degradation in the light-emission output, and high output is secured.

According to the light-emitting diode of the invention, a configuration in which the In composition X1 of the well layer is 0≤X1≤0.3, and the thickness of the well layer is 3 to 10 nm is introduced, whereby the response speed is high and high output is realized compared to an infrared light-emitting diode of the related art.

According to the light-emitting diode of the invention, a configuration in which the functional substrate is transparent to the light-emission wavelength is introduced, whereby high output is realized compared to a light-emitting diode which uses a substrate with absorption.

According to the light-emitting diode of the invention, a configuration in which the functional substrate is made of GaP, sapphire, SiC, silicon, or germanium is introduced. Accordingly, the functional substrate has a thermal expansion coefficient close to the light-emitting portion, whereby stress can be reduced. Furthermore, since the functional substrate is unlikely to be corroded, moisture resistance is improved.

According to the light-emitting diode of the invention, a configuration in which both the functional substrate and the electric current diffusion layer are made of GaP is introduced, whereby bonding strength therebetween can be increased.

BRIEF DESCRIPTION OF DRAWINGS

FIG. 13(a) is a plan view, and FIG. 13(b) is a schematic cross-sectional view taken along the line C-C' of FIG. 13(a).

DESCRIPTION OF EMBODIMENTS

Figure 1:
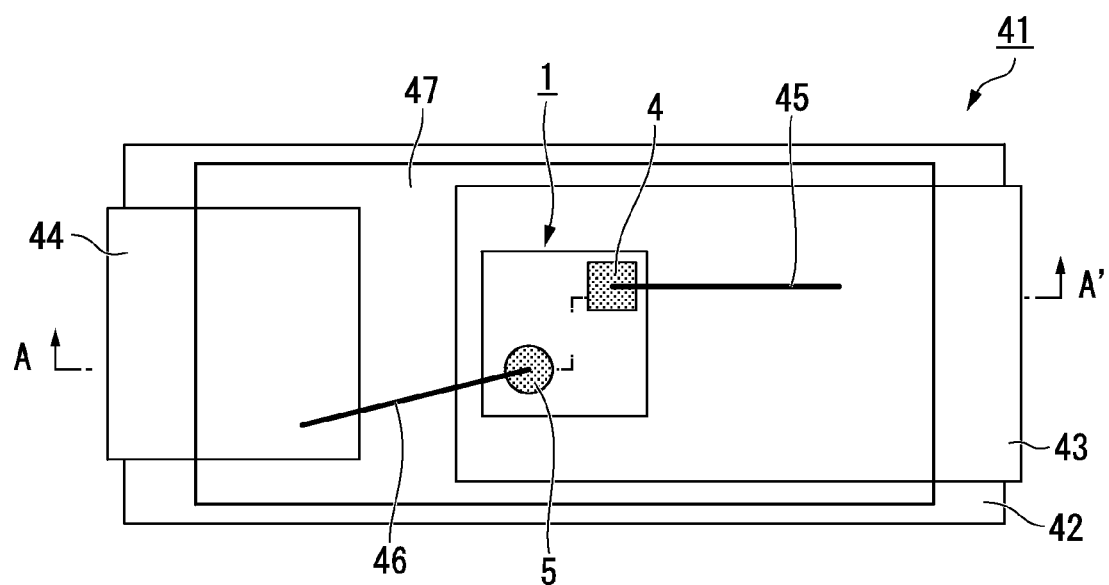
FIG. 1 is a plan view illustrating a light-emitting diode lamp using a light-emitting diode according to an embodiment of the invention.

Hereinafter, a light-emitting diode according to an embodiment to which the invention is applied and a light-emitting diode lamp using the same will be described in detail with reference to the drawings. In the drawings which are used in the following description, the same members are represented by the same reference signs or the signs are omitted. The drawings which are used in the following description are schematically shown, and the ratios of length, width, and thickness, and the like may not be the same as in reality.

<Light-Emitting Diode Lamp>

Figure 2:
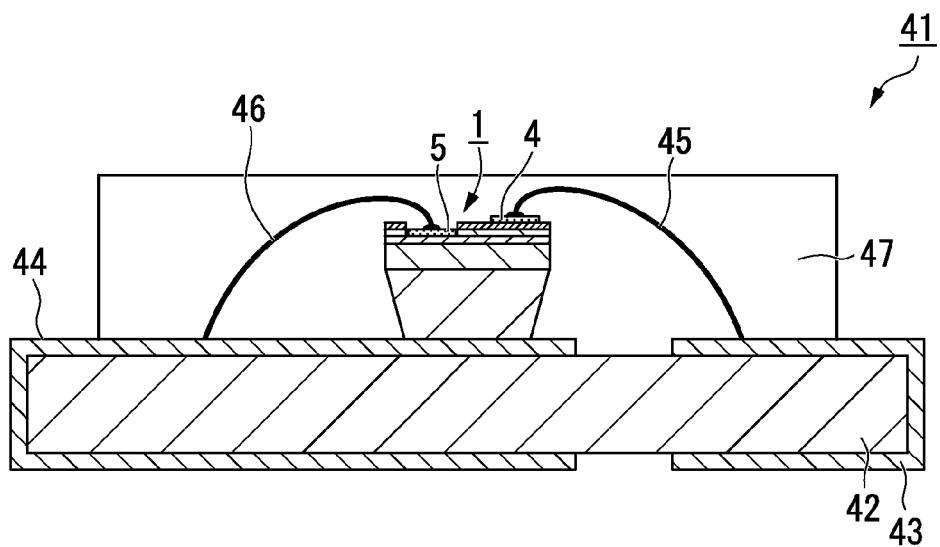
FIG. 2 is a cross-sectional view schematically illustrating a light-emitting diode lamp using a light-emitting diode according to an embodiment of the invention taken along the line A-A' of FIG. 1.

FIGS. 1 and 2 are diagrams illustrating a light-emitting diode lamp using a light-emitting diode according to an embodiment of the invention. FIG. 1 is a plan view and FIG. 2 is a cross-sectional view taken along the line A-A' of FIG. 1.

As shown in FIGS. 1 and 2, a light-emitting diode lamp 41 using a light-emitting diode 1 according to this embodiment includes one or more light-emitting diodes 1 mounted on the surface of a mounting substrate 42.

Specifically, an n electrode terminal 43 and a p electrode terminal 44 are provided on the surface of the mounting substrate 42. An n-type ohmic electrode 4, which is a first electrode of the light-emitting diode 1, and an n electrode terminal 43 of the mounting substrate 42 are connected to each other using a gold wire 45 (wire bonding). A p-type ohmic electrode 5, which is a second electrode of the light-emitting diode 1, and a p electrode terminal 44 of the mounting substrate 42 are connected to each other by a gold wire 46. The surface of the mounting substrate 42 on which the light-emitting diode 1 is mounted is sealed by general seal resin 47, such as silicon resin or epoxy resin.

Light-Emitting Diode

First Embodiment

Figure 3:
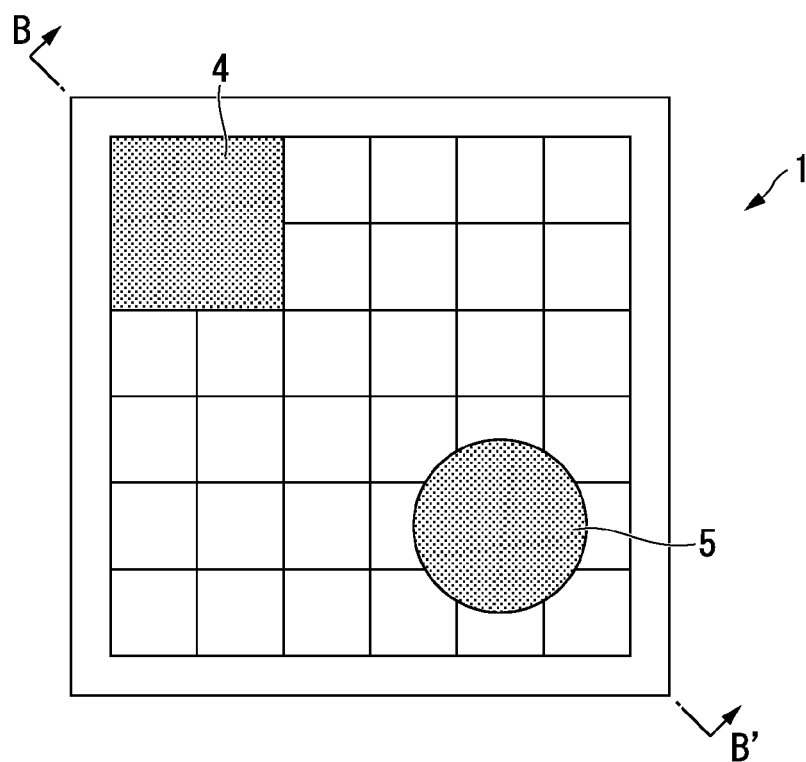
FIG. 3 is a plan view illustrating a light-emitting diode according to an embodiment of the invention.
Figure 4:
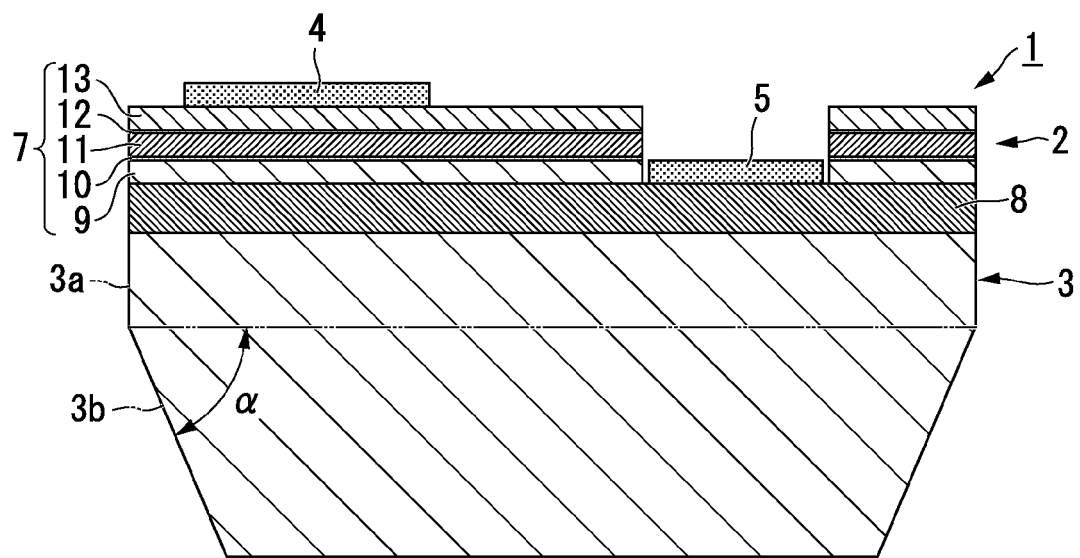
FIG. 4 is a cross-sectional view schematically illustrating a light-emitting diode according to an embodiment of the invention taken along the line B-B' of FIG. 3.
Figure 5:
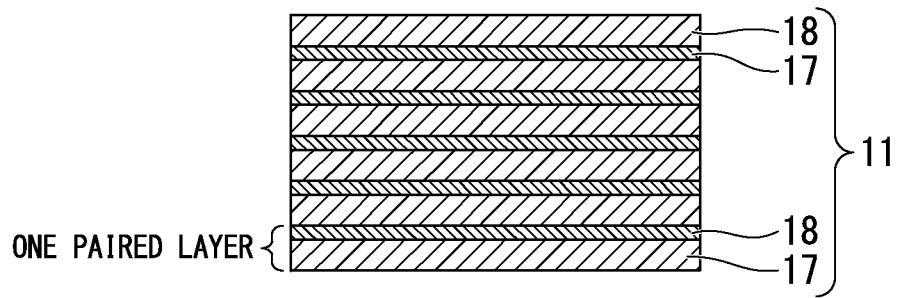
FIG. 5 is a diagram illustrating an active layer which constitutes a light-emitting diode according to an embodiment of the invention.

FIGS. 3 and 4 are diagrams illustrating a light-emitting diode according to a first embodiment to which the invention is applied. FIG. 3 is a plan view, and FIG. 4 is a cross-sectional view taken along the line B-B' of FIG. 3. FIG. 5 is a cross-sectional view of a laminated structure of a well layer and a barrier layer.

The light-emitting diode according to the first embodiment includes a light-emitting portion 7 which has an active layer 11 of a quantum well structure, in which a well layer 17 made of a compound semiconductor having a composition formula $(In_{X1}Ga_{1-X1})As$ ($0 \le X1 \le 1$) and a barrier layer 18 made of a compound semiconductor having a composition formula $(Al_{X2}Ga_{1-X2})As$ ($0 \le X2 \le 1$) are alternately laminated, and a first clad layer 9 and a second clad layer 13 sandwiching the active layer 11, an electric current diffusion layer 8 which is formed on the light-emitting portion 7, and a functional substrate 3 which is bonded to the electric current diffusion layer 8. The first and second clad layers 9 and 13 are made of a compound semiconductor having a composition formula $(Al_{X3}Ga_{1-X3})_{Y1}In_{1-Y1}P$ ($0 \leq X3 \leq 1$, $0 < Y1 \leq 1$), and the number of paired layers of the well layer 17 and the barrier layer 18 is equal to or smaller than 5.

In this embodiment, a principal light extraction surface is the surface opposite to the surface of the compound semiconductor layer 2 to which the functional substrate 3 is attached.

As shown in FIG. 4, a compound semiconductor layer (also referred to as an epitaxial layer) 2 has a structure in which the pn junction-type light-emitting portion 7 and an electric current diffusion layer 8 are sequentially laminated. A known functional layer can timely be added to the structure of the compound semiconductor layer 2. For example, a known layer structure including a contact layer for reducing the contact resistance of an ohmic electrode, a current diffusion layer for diffusing an element-driving current on the entire plane of a light-emitting portion, and a current-blocking layer or a current-confining layer for limiting the region in which the element-driving current flows may be provided. It is preferable that the compound semiconductor layer 2 be formed through epitaxial growth on the GaAs substrate.

As shown in FIG. 4, the light-emitting portion 7 has a configuration in which at least a p-type lower clad layer (first clad layer) 9, a lower guide layer 10, an active layer 11, an upper guide layer 12, and an n-type upper clad layer (second clad layer) 13 are sequentially laminated on the electric current diffusion layer 8. That is, from the viewpoint of high-intensity light-emission, the light-emitting portion 7 preferably has a double hetero (abbreviated as DH) structure, in which the lower clad layer 9 and the lower guide layer 10 are arranged to face the upper guide layer 12 and the upper clad layer 13 on the upper and lower sides of the active layer 11, so as to "confine" carriers which carry radiative recombination and light-emission in the active layer 11.

As shown in FIG. 5, the active layer 11 has a quantum well structure so as to control the light-emission wavelength of the light-emitting diode (LED). That is, the active layer 11 has a multilayer structure (laminated structure) of the well layer 17 and the barrier layer 18 with the barrier layer 18 at both ends. Accordingly, for example, when a single well layer 17 and a single barrier layer 18 form a single paired layer, a quantum well structure of five paired layers has five well layers 17 and six barrier layers 18.

It is preferable that the thickness of the active layer 11 be in a range of 0.02 to 2 μm. The conduction type of the active layer 11 is not particularly limited, and undoped, p type, or n type may be selected. In order to enhance light emission efficiency, it is preferable that the active layer 11 be made to be undoped or have a carrier concentration of less than $3 \times 10^{17}$ cm$^{-3}$, and have excellent crystallinity. If crystallinity is improved and defects are reduced, absorption of light is suppressed, and as a result, the improvement of a light-emission output can be achieved.

The well layer 17 is made of a compound semiconductor of a composition formula $(In_{X1}Ga_{1-X1})As$ ($0 \leq X1 \leq 1$).

It is preferable that the In composition X1 be $0 \leq X1 \leq 0.3$. If the In composition X1 is within the above range, a desired light-emission wavelength can be within a range of 830 to 1,000 nm.

Table 1 shows the correlation between the In composition (X1) and the light-emission peak wavelength when the thickness of the well layer 17 is fixed to 5 nm. As shown in Table 1, it is understood that the lower the In composition (X1) of the well layer 17, the longer the light-emission peak wavelength. From the tendency of this change, the In composition (X1) corresponding to the light-emission peak wavelength not described in Table 1 can be estimated.

TABLE 1

| Peak Wavelength (nm) | In Composition (x) |
|---|---|
| 820 | 0.00 |
| 840 | 0.05 |
| 860 | 0.10 |
| 890 | 0.15 |
| 920 | 0.20 |
| 960 | 0.25 |
| 1000 | 0.30 |

The thickness of the well layer 17 is preferably within a range of 3 to 30 nm, and more preferably, within a range of 3 to 10 nm.

Table 2 shows the correlation between the thickness of the well layer 17 and the light-emission peak wavelength when the In composition (X1) of the well layer 17 is 0.20. Table 3 shows the relationship between the thickness of the well layer 17 and the light-emission peak wavelength when the In composition (X1) of the well layer 17 is 0.05.

TABLE 2

| Peak Wavelength (nm) | Thickness (nm) |
|---|---|
| 890 | 3 |
| 920 | 5 |
| 940 | 7 |

TABLE 3

| Peak Wavelength (nm) | Thickness (nm) |
|---|---|
| 820 | 3 |
| 840 | 5 |
| 870 | 7 |

As shown in Tables 2 and 3, if the thickness of the well layer 17 is small, the light-emission peak wavelength is shortened by the quantum effect. Meanwhile, when the thickness is large, the light-emission peak wavelength is determined by the composition. From the tendencies of these changes, the thickness corresponding to the light-emission peak wavelength not described in Tables 2 and 3 can be estimated.

The In composition (X1) and the thickness of the well layer 17 can be determined on the basis of the above-described relationship between the light-emission peak wavelength and the In composition (X1) and the thickness of the well layer 17 such that a desired light-emission wavelength is obtained within a range of 830 nm to 1,000 nm.

For example, a light-emitting diode in which the In composition X1 of the well layer is $0 \leq X1 \leq 0.3$, the thickness of the well layer is within a range of 3 to 10 nm, and the light-emission wavelength is set to 830 to 1,000 nm can be manufactured.

The barrier layer 18 is made of a compound semiconductor having a composition formula $(Al_{X2}Ga_{1-X2})As$ ($0 \leq X2 \leq 1$). It is preferable that X have a composition which makes the band gap greater than the well layer 17 so as to present absorption in the barrier layer 18 and to increase light-emission efficiency. In the barrier layer 18, it is preferable that the Al concentration be low from the viewpoint of crystallinity.

Accordingly, it is more preferable that the Al composition X2 of the barrier layer 18 be within a range of 0.1 to 0.3.

The optimum composition of X2 is determined by the relationship with the composition of the well layer. If crystallinity is improved and defects are reduced, absorption of light is suppressed, and as a result, the improvement of the light-emission output can be achieved.

It is preferable that the thickness of the barrier layer 18 be equal to the thickness of the well layer 17 or be greater than the thickness of the well layer 17. If the thickness of the barrier layer 18 is sufficiently large within a thickness range in which the tunnel effect occurs, both the combination of the well layer by the tunnel effect and the suppression of the expansion are supported, whereby the carrier confinement effect can be increased, the light-emission recombination probability of electrons and holes can be increased, and the improvement of the light-emission output can be achieved.

In the light-emitting diode of the invention, the number of pairs of the well layer 17 and the barrier layer 18 alternately laminated in the multilayer structure of the well layer 17 and the barrier layer 18 is equal to or smaller than 5, and a single paired layer may be provided. That is, it is preferable that the active layer 11 include one to five well layers 17. With this configuration, the carrier confinement effect increases, and the light-emission recombination probability of electrons and holes increases, thereby securing a high response speed (rising time) equal to or lower than 25 nsec. As shown in the examples described below, the smaller the number of paired layers of the well layer 17 and the barrier layer 18 from five to one, the higher the response speed. Under the conditions shown in the examples, when the number of paired layers was one, the maximum speed of 15 nsec was realized. In the case of an active layer of a multiple quantum well structure, since the smaller the number of quantum well layers, the narrower a region where holes and electrons are confined, the light-emission recombination probability increases, and as a result, the response speed becomes higher.

Figure 6:
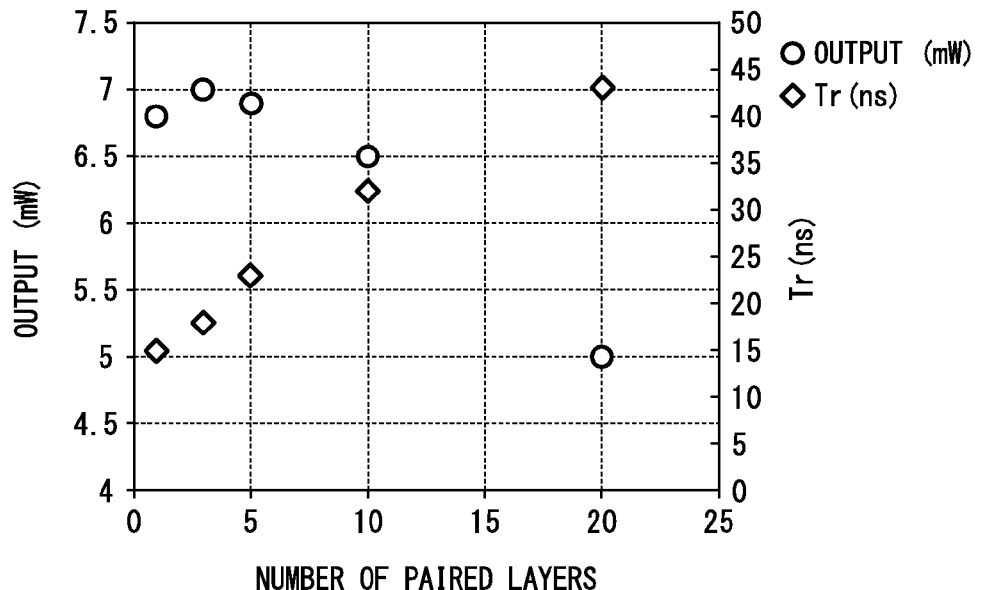
FIG. 6 is a graph illustrating the correlation between the number of paired layers of a well layer and a barrier layer, a light-emission output, and a response speed of a light-emitting diode according to a first embodiment of the invention (when a bonded area of an active layer and a clad layer is 123,000 $\mu m^2$).
Figure 7:
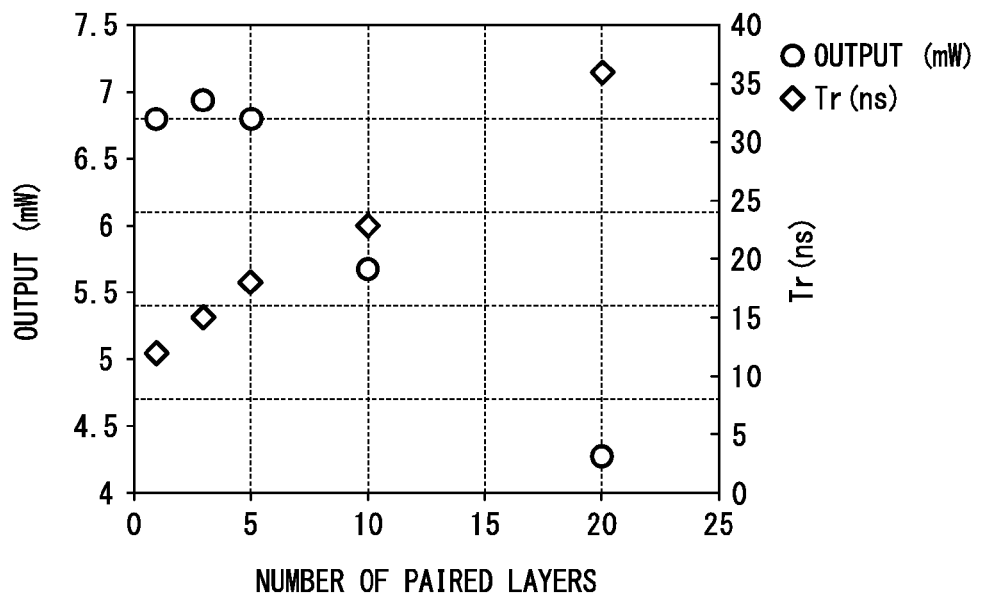
FIG. 7 is a graph illustrating the correlation between the number of paired layers of a well layer and a barrier layer of the light-emitting diode according to the first embodiment of the invention, a light-emission output, and a response speed (when a bonded area of an active layer and a clad layer is 53,000 $\mu m^2$).

FIGS. 6 and 7 are respectively graphs showing the correlation between the number of paired layers of a well layer and a barrier layer of a light-emitting diode, and a light-emission output and a response speed when the bonded area of the active layer 11 and the lower clad layer 9 or the upper clad layer 13 is 123,000 $\mu m^2$ (350 $\mu m \times 350$ $\mu m$: FIG. 6) and when the bonded area is narrower, 53,000 $\mu m^2$ (230 $\mu m \times 230$ $\mu m$: FIG. 7).

From the graphs shown in FIGS. 6 and 7, it should suffice that the number of well layers 17 is one if light-emission efficiency of the active layer 11 is within a preferred range. Since there is lattice mismatch between the well layer 17 and the barrier layer 18, if there are too many paired layers, light-emission efficiency is degraded due to the occurrence of crystal defects.

For this reason, in the invention, the number of paired layers of the well layer 17 and the barrier layer 18 is equal to or smaller than 5.

For example, in the case of data shown in the graph of FIG. 6, when the number of paired layers of the well layer 17 and the barrier layer 18 is one, the light-emission output is 6.8 mW and the response speed Tr is 15 nsec, when the number of paired layers is three, the light-emission output is 7 mW and the response speed Tr is 18 nsec, when the number of paired layers is five, the light-emission output is 6.9 mW and the response speed Tr is 23 nsec. In all cases, high light-emission efficiency and high-speed response are obtained. When the number of paired layers of the well layer and the barrier layer is 10, the light-emission output is 6.5 mW and the response speed Tr is 32 nsec, and the output and the response speed are inferior compared to a case where the number of paired layers is one to five. When the number of paired layers of the well layer and the barrier layer is 20, the light-emission output is lowered to 5.0 mW, the response speed Tr becomes 43 nsec, and it is understood that both light-emission efficiency and high-speed performance are inferior.

In the case of data shown in the graph of FIG. 7, when the number of paired layers of the well layer 17 and the barrier layer 18 is one, the light-emission output is 7.0 mW and the response speed Tr is 12 nsec, when the number of paired layers is three, the light-emission output is 7.1 mW and the response speed Tr is 15 nsec, and when the number of paired layers is five, the light-emission output is 7.0 mW and the response speed Tr is 18 nsec. In all cases, high light-emission efficiency and high-speed response are obtained. When the number of paired layers of the well layer and the barrier layer is 10, the light-emission output is 6.2 mW, the response speed Tr is 23 nsec, and the output and the response speed are inferior compared to a case where the number of paired layers is one to five. When the number of paired layers of the well layer and the barrier layer is 20, the light-emission output is lowered to 5.2 mW, the response speed Tr becomes 36 nsec, and it is understood that both light-emission efficiency and high-speed performance are inferior.

In both cases of FIGS. 6 and 7, of the cases where the number of paired layers is one to five, when the number of paired layers of the well layer 17 and the barrier layer 18 is three, the response speed Tr is 18 nsec and 15 nsec to be excellent in high-speed performance, and the output is 7.0 mV and 7.1 mV to be maximal. For this reason, when the light-emission output is given top priority, it is most preferable that the number of paired layers be three.

From the viewpoint of high-speed performance, although it is preferable that a single paired layer be provided, since the confinement of electrons and holes is limited within a very small range, the saturation of the output with respect to an increase in an injection current is likely to occur. Meanwhile, since the well layer of the invention undergoes distortion, in a region where the number of paired layers is equal to or greater than three, crystal defects by distortion are expanded along with an increase in the number of paired layers and the output is lowered. From this, although the response speed is inferior to a structure in which the number of paired layers is two or less, it is more preferable that the number of paired layers be three taking into consideration the balance with the output.

If the number of well layers 17 and barrier layers 18 decreases, the junction capacitance (capacitance) of the PN junction increases. This is because the well layer 17 and the barrier layer 18 are made to be undoped or have a low carrier concentration and thus function as a depletion layer in the PN junction, and the smaller the thickness of the depletion layer, the greater the capacitance.

In general, although it is desirable to make the capacitance small so as to increase the response speed, in the structure of the invention, it has been found that, if the number of well layers 17 and barrier layers 18 decreases, the response speed increases regardless of an increase in capacitance. It is estimated that this is because, if the number of well layers 17 and barrier layers 18 decreases, the effect of increasing the recombination rate of injected carriers further increases.

It is preferable that the bonded area of the active layer 11 and the lower clad layer 9 or the upper clad layer 13 be 20,000 to 90,000 $\mu m^2$.

If the bonded area of the active layer 11 and the lower clad layer 9 or the upper clad layer 13 is equal to or smaller than 90,000 $\mu m^2$, the current density becomes higher, and the light-emission recombination probability increases, thereby improving the response speed. As shown in the examples described below, the inventors have conducted an experiment and it has become apparent that, in the cases where the bonded area of the active layer 11 and the lower clad layer 9 or the upper clad layer 13 is 123,000 µm² (350 µm×350 µm) and the bonded area is narrower to be 53,000 µm² (230 µm×230 µm), in the latter case, when the number of paired layers of the well layer 17 and the barrier layer 18 is five, the response speed is improved by 20% or more, and even when the number of paired layers is one, the response speed is improved by 20%.

If the bonded area of the active layer 11 and the lower clad layer 9 or the upper clad layer 13 is equal to or greater than 20,000 µm², there is no significant degradation of the light-emission output, and a high output is secured. As shown in the examples described below, the inventors have conducted an experiment, and it has become apparent that, in the case where the bonded area of the active layer 11 and the lower clad layer 9 or the upper clad layer 13 is 53,000 µm², when the number of paired layers of the well layer 17 and the barrier layer 18 is five, the light-emission output is 7.0 mW (the response speed is 18 nsec), and even when the number of paired layers is one, the light-emission output is 7.0 mW (the response speed is 12 nsec), thereby maintaining a high light-emission output.

In this embodiment, as illustrated in FIG. 4, the lower guide layer 10 and the upper guide layer 12 are respectively provided on the lower surface and the upper surface of the active layer 11. Specifically, the lower guide layer 10 is provided on the lower surface of the active layer 11, and the upper guide layer 12 is provided on the upper surface of the active layer 11.

The lower guide layer 10 and the upper guide layer 12 have a composition of $(Al_{X6}Ga_{1-X6})As$ ($0<X6\leq1$). The Al composition X6 is preferably a composition which makes the band gap equal to or greater than the barrier layer, and more preferably, is in a range of 0.2 to 0.5.

From the viewpoint of crystallinity, the optimum composition of X6 is determined by the relationship with the composition of the well layer 17. If crystallinity is improved and defects are reduced, absorption of light is suppressed, and as a result, the improvement of the light-emission output can be achieved.

Table 4 shows the Al composition (X2, X6) of the barrier layer 18, the lower guide layer 10, and the upper guide layer 12 in which, when the thickness of the well layer 17 is 5 nm, a light-emission output at each light-emission peak wavelength is maximal. Although the barrier layer 18, the lower guide layer 10, and the upper guide layer 12 have a composition which makes the band gap greater than the well layer 17, in order to increase crystallinity and to improve the light-emission output, the optimum composition is determined by the relationship with the composition of the well layer 17. In this way, if the crystallinity of the barrier layer 18, the lower guide layer 10, and the upper guide layer 12 is improved and defects are reduced, absorption of light is suppressed, and as a result, the improvement of the light-emission output can be achieved.

TABLE 4

| Peak Wavelength (nm) | Well (x) | Barrier (x) | Guide (x) |
|---|---|---|---|
| 820 | 0.00 | 0.2 | 0.4 |
| 840 | 0.05 | 0.2 | 0.4 |
| 860 | 0.10 | 0.2 | 0.4 |
| 890 | 0.15 | 0.1 | 0.3 |
| 920 | 0.20 | 0.1 | 0.3 |
| 960 | 0.25 | 0.0 | 0.2 |
| 1000 | 0.30 | 0.0 | 0.2 |

The lower guide layer 10 and the upper guide layer 12 are provided so as to reduce propagation of defects between the lower and upper clad layers 9 and 13 and the active layer 11.

That is, while a constituent element belonging to Group V of each of the lower guide layer 10, the upper guide layer 12, and the active layer 11 is arsenic (As), in the invention, a constituent element belonging to Group V of each of the lower clad layer 9 and the upper clad layer 13 is phosphorous (P), therefore, defects are likely to occur in the interface. The propagation of defects to the active layer 11 causes degradation in performance of the light-emitting diode. For this reason, the thickness of each of the lower guide layer 10 and the upper guide layer 12 is preferably equal to or greater than 10 nm, and more preferably, 20 nm to 100 nm.

The conduction type of each of the lower guide layer 10 and the upper guide layer 12 is not particularly limited, and undoped, p type, or n type may be selected. In order to enhance light emission efficiency, it is preferable that the lower guide layer 10 and the upper guide layer 12 be made to be undoped or have a carrier concentration of less than $3\times10^{17}$ cm$^{-3}$, and have excellent crystallinity.

As shown in FIG. 4, the lower clad layer 9 and the upper clad layer 13 are respectively provided on the lower surface of the lower guide layer 10 and the upper surface of the upper guide layer 12.

The lower clad layer 9 and the upper clad layer 13 are made of a compound semiconductor of $(Al_{X3}Ga_{1-X3})_{Y1}In_{1-Y1}P$ ($0\leq X3\leq1$, $0<Y1\leq1$), a material which has a band gap greater than the barrier layer 18 is preferably used, and a material which has a band gap greater than the lower guide layer 10 and the upper guide layer 12 is more preferably used. As the above material, it is preferable that the Al composition X3 $(Al_{X3}Ga_{1-X3})_{Y1}In_{1-Y1}P$ ($0\leq X3\leq1$, $0<Y1\leq1$) be 0.2 to 0.4. It is also preferable that Y1 be 0.4 to 0.6. X3 is selected in a range in which the function of a clad layer is exhibited, transparency to the light-emission wavelength is secured, and Y1 is selected in a range in which a clad layer is thick, and satisfactory crystal growth is possible from the viewpoint of lattice match with a substrate.

The lower clad layer 9 and the upper clad layer 13 are different in polarity. In regard to the carrier concentration and thickness of each of the lower clad layer 9 and the upper clad layer 13, known appropriate ranges may be used, and it is preferable that the conditions be optimized such that the light-emission efficiency of the active layer 11 is increased. The composition of each of the lower clad layer 9 and the upper clad layer 13 is controlled, thereby reducing warping of the compound semiconductor layer 2.

Specifically, as the lower clad layer 9, for example, it is desirable that a Mg-doped p-type semiconductor material of $(Al_{X3a}Ga_{1-X3a})_{Y1a}In_{1-Y1a}P$ ($0.3\leq X3a\leq0.7$, $0.4\leq Y1a\leq0.6$) be used. The carrier concentration is preferably in a range of $2\times10^{17}$ to $2\times10^{18}$ cm$^{-3}$, and the thickness is preferably in a range of 0.1 to 1 µm.

As the upper clad layer 13, for example, it is desirable that a Si-doped n-type semiconductor material of $(Al_{X3b}Ga_{1-X3b})_{Y1b}In_{1-Y1b}P$ ($0.3\leq X3b\leq0.7$, $0.4\leq Y1b\leq0.6$) be used. The carrier concentration is preferably in a range of $1\times10^{17}$ to $1\times10^{18}$ cm$^{-3}$, and the thickness is preferably in a range of 0.1 to 1 µm.

The polarity of each of the lower clad layer 9 and the upper clad layer 13 may be selected taking into consideration the element structure of the compound semiconductor layer 2.

A known layer structure including a contact layer for reducing the contact resistance of an ohmic electrode, a current diffusion layer for diffusing an element-driving current on the entire plane of a light-emitting portion, and a current-blocking layer or a current-confining layer for limiting the region in which the element-driving current flows reversely may be provided on the structural layers of the light-emitting portion 7.

As shown in FIG. 4, the electric current diffusion layer 8 is provided below the light-emitting portion 7. The electric current diffusion layer 8 lessens distortion caused by the active layer 12 when the compound semiconductor layer 2 is epitaxially grown on the GaAs substrate.

For the electric current diffusion layer 8, a material which is transparent to the light-emission wavelength from the light-emitting portion 7 (active layer 11), for example, GaP, may be applied. When GaP is applied for the electric current diffusion layer 8, if the functional substrate 3 is a GaP substrate, bonding can be facilitated, and high bonding strength can be obtained.

Further, the electric current diffusion layer 8 preferably has a thickness of 0.5 to 20 μm. This is because, if the thickness is equal to or smaller than 0.5 μm, current diffusion is not sufficient, and if the thickness is equal to or greater than 20 μm, cost for growing crystal to this thickness increases.

The functional substrate 3 is bonded to the surface of the compound semiconductor layer 2 opposite to the principal light extraction surface. That is, as shown in FIG. 4, the functional substrate 3 is bonded to the electric current diffusion layer 8 which constitutes the compound semiconductor layer 2. The functional substrate 3 is made of a material which has strength sufficient for mechanically supporting the light-emitting portion 7, can transmit light emitted from the light-emitting portion 7, and is optically transparent to the light-emission wavelength from the active layer 11. A material which is excellent in moisture resistance and chemically stable is desirable, and a material with no Al or the like, which is likely to be corroded, is desirably introduced.

The functional substrate 3 is a substrate which has a thermal expansion coefficient close to the light-emitting portion and is excellent in moisture resistance, and is preferably made of GaP or SiC having satisfactory thermal conductivity or sapphire having high mechanical strength. It is preferable that the functional substrate 3 have a thickness equal to or greater than, for example, about 50 μm so as to support the light-emitting portion 7 with sufficient mechanical strength. In order to facilitate mechanical processing on the functional substrate 3 after having been bonded to the compound semiconductor layer 2, it is preferable that the thickness not exceed about 300 μm. That is, it is most preferable that the functional substrate 3 be made of an n-type GaP substrate having a thickness equal to or greater than about 50 μm and equal to or smaller than about 300 μm from the viewpoint of transparency and cost.

As shown in FIG. 4, the lateral surface of the functional substrate 3 has a vertical surface 3a which is substantially perpendicular to the principal light extraction surface on the side near the compound semiconductor layer 2, and an inclined surface 3b which is inwardly inclined with respect to the principal light extraction surface on the side away from the compound semiconductor layer 2. The term "substantially vertical" is a generic term that includes a gap of −5° to 5° in the vertical direction, preferably −3° to 3°, and more preferably −1° to 1°. Accordingly, light emitted from the active layer 11 toward the functional substrate 3 can be efficiently extracted to the outside. Of light emitted from the active layer 11 toward the functional substrate 3, a part can be reflected by the vertical surface 3a and extracted from the inclined surface 3b. Light reflected from the inclined surface 3b can be extracted from the vertical surface 3a. In this way, it is possible to improve light emission efficiency with the synergistic effect of the vertical surface 3a and the inclined surface 3b.

In this embodiment, as shown in FIG. 4, it is preferable that the angle α formed between the inclined surface 3b and a plane parallel to the light-emitting surface be in a range of 55 degrees to 80 degrees. With this range, light reflected at the bottom of the functional substrate 3 can be efficiently extracted to the outside.

It is preferable that the width of the vertical surface 3a (in the thickness direction) be in a range of 30 μm to 100 μm. If the width of the vertical surface 3a is within the above range, light reflected at the bottom of the functional substrate 3 can be efficiently returned to the light-emitting surface using the vertical surface 3a, and can be then emitted from the principal light extraction surface. Accordingly, it is possible to increase the light-emission efficiency of the light-emitting diode 1.

It is preferable that the inclined surface 3b of the functional substrate 3 be roughened. If the inclined surface 3b is roughened, the effect of increasing light extraction efficiency from the inclined surface 3b is obtained.

That is, when the inclined surface 3b is roughened, total reflection from the inclined surface 3b is prevented, thereby improving the light extraction efficiency.

The bonded interface of the compound semiconductor layer 2 and the functional substrate 3 may become a high-resistance layer.

That is, a high-resistance layer (not shown) may be formed between the compound semiconductor layer 2 and the functional substrate 3. The high-resistance layer has a resistance value higher than the functional substrate 3, and when a high-resistance layer is formed, the high-resistance layer has a function of reducing a reverse current from the electric current diffusion layer 8 of the compound semiconductor layer 2 toward the functional substrate 3. Although a bonded structure which exhibits voltage endurance with respect to the reverse current to be improperly applied from the functional substrate 3 toward the electric current diffusion layer 8 is made, it is preferable that the breakdown voltage have a value lower than a reverse voltage of the pn junction-type light-emitting portion 7.

The n-type ohmic electrode (first electrode) 4 and the p-type ohmic electrode (second electrode) 5 are low-resistance ohmic contact electrodes provided on the principal light extraction surface of the light-emitting diode 1.

The n-type ohmic electrode 4 is provided above the upper clad layer 11, and for example, AuGe or an alloy made of Ni alloy/Au may be used. As shown in FIG. 4, as the p-type ohmic electrode 5, an alloy made of AuBe/Au or AuZn/Au may be used on the exposed surface of the electric current diffusion layer 8.

Here, in the light-emitting diode 1 according to this embodiment, it is preferable that the p-type ohmic electrode 5 serving as the second electrode be formed on the electric current diffusion layer 8. According to this structure, the effect of reducing the operating voltage is obtained. When the p-type ohmic electrode 5 is formed on the electric current diffusion layer 8 made of p-type GaP, a satisfactory ohmic contact is obtained. Therefore, it is possible to reduce the operating voltage.

In this embodiment, it is preferable that the polarity of the first electrode be n and the polarity of the second electrode be p. According to this structure, it is possible to increase the brightness of the light-emitting diode 1. When the first electrode is of p type, current diffusion deteriorates, which causes a reduction in brightness. In contrast, when the first electrode is an n-type electrode, current diffusion is improved and it is possible to increase the brightness of the light-emitting diode 1.

In the light-emitting diode 1 according to this embodiment, as shown in FIG. 3, it is preferable that the n-type ohmic electrode 4 and the p-type ohmic electrode 5 be diagonally arranged. In addition, it is most preferable that the p-type ohmic electrode 5 be surrounded by the compound semiconductor layer 2. According to this structure, the effect of reducing the operating voltage is obtained. When the p-type ohmic electrode 5 is surrounded by the n-type ohmic electrode 4, it is easy for a current to flow in all directions. As a result, the operating voltage is reduced.

In the light-emitting diode 1 according to this embodiment, as shown in FIG. 3, it is preferable that the n-type ohmic electrode 4 be formed in a net shape, such as a honeycomb shape or a lattice shape. According to this structure, the effect of improving reliability is obtained. With the lattice shape, a current can be injected uniformly into the active layer 11, and as a result, the effect of improving reliability is obtained.

In the light-emitting diode 1 of this embodiment, it is preferable that the n-type ohmic electrode 4 have a pad-shaped electrode (pad electrode) and a line-shaped electrode (linear electrode) having a width equal to or smaller than 10 μm. According to this structure, it is possible to improve brightness. When the width of the linear electrode is reduced, it is possible to increase the area of an aperture in the light-emitting surface and thus to improve brightness.

In this embodiment, though not shown, a configuration in which a third electrode is formed on the rear side of the functional substrate 3 may be introduced. With the configuration in which the third electrode is provided, in a transparent substrate (functional substrate), a structure in which light is reflected toward the substrate is made, thereby achieving higher output performance. As a reflective metal material, a material, such as Au, Ag, or Al, may be used.

The front surface of the electrode is formed of a eutectic metal, such as AuSn, or a solder material, whereby it is not necessary to use paste in a die bonding process, and thus the process can be simplified. The functional substrate 3 and the n electrode terminal 43 are connected together by a third electrode made of a metal, whereby thermal conductivity is improved and thus the heat dissipation characteristic of the light-emitting diode is improved.

<Method of Manufacturing Light-Emitting Diode>

Figure 8:
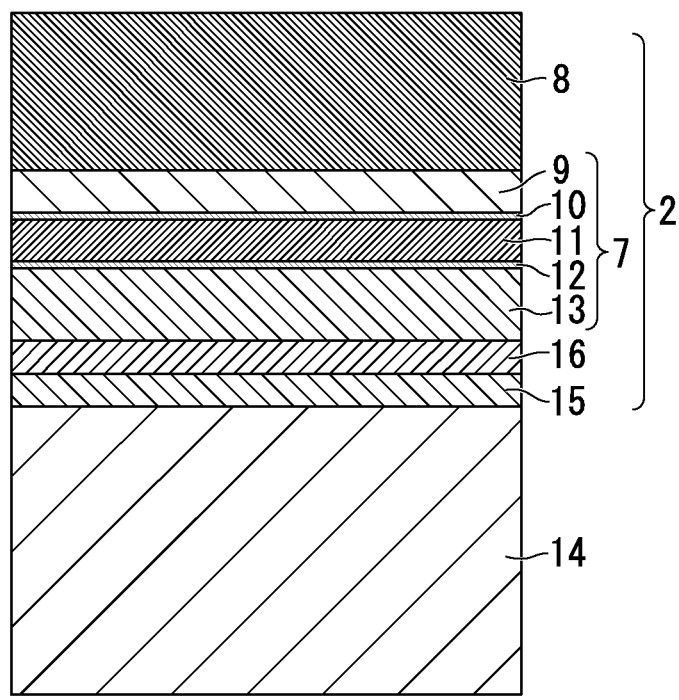
FIG. 8 is a schematic cross-sectional view illustrating an epitaxial wafer which is used in a light-emitting diode according to an embodiment of the invention.
Figure 9:
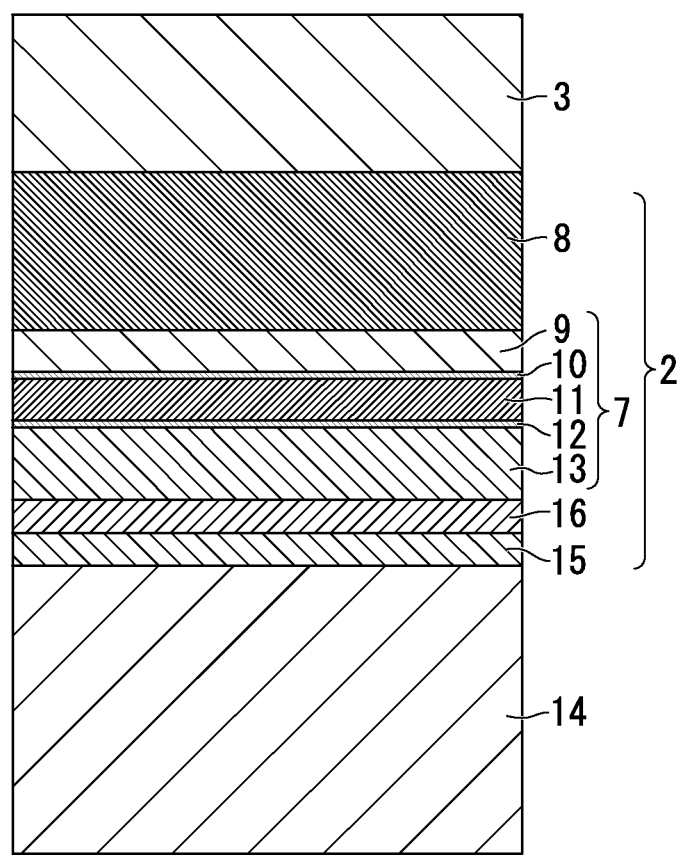
FIG. 9 is a schematic cross-sectional view illustrating a bonded wafer which is used in a light-emitting diode according to an embodiment of the invention.
Figure 10:
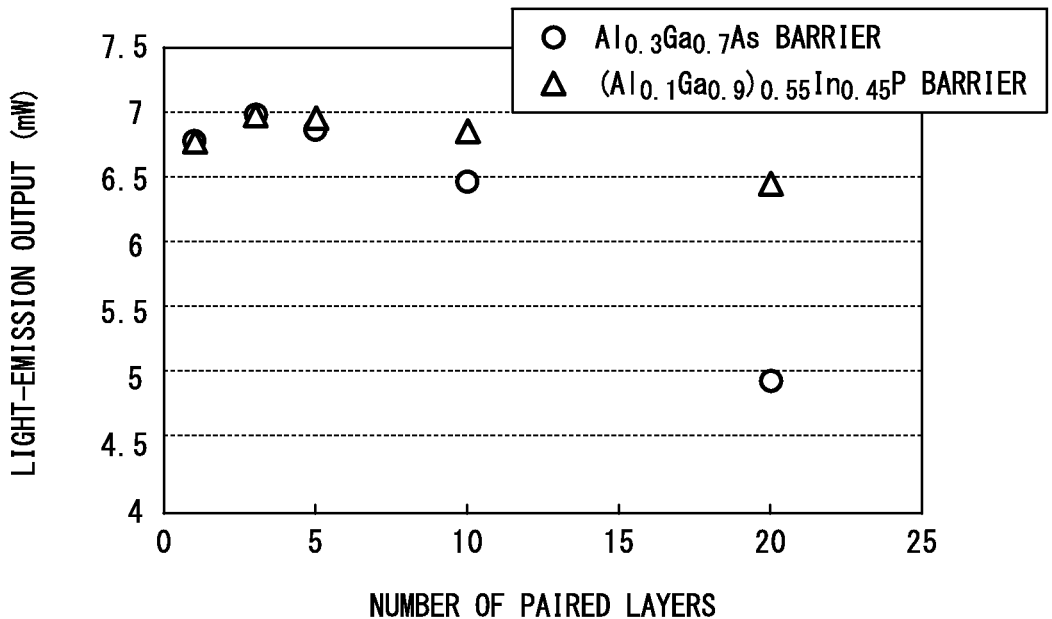
FIG. 10 is a graph illustrating the correlation between the number of paired layers of a well layer and a barrier layer of a light-emitting diode and a light-emission output when AlGaInP is used in a barrier layer of a light-emitting diode according to an embodiment of the invention.
Figure 11:
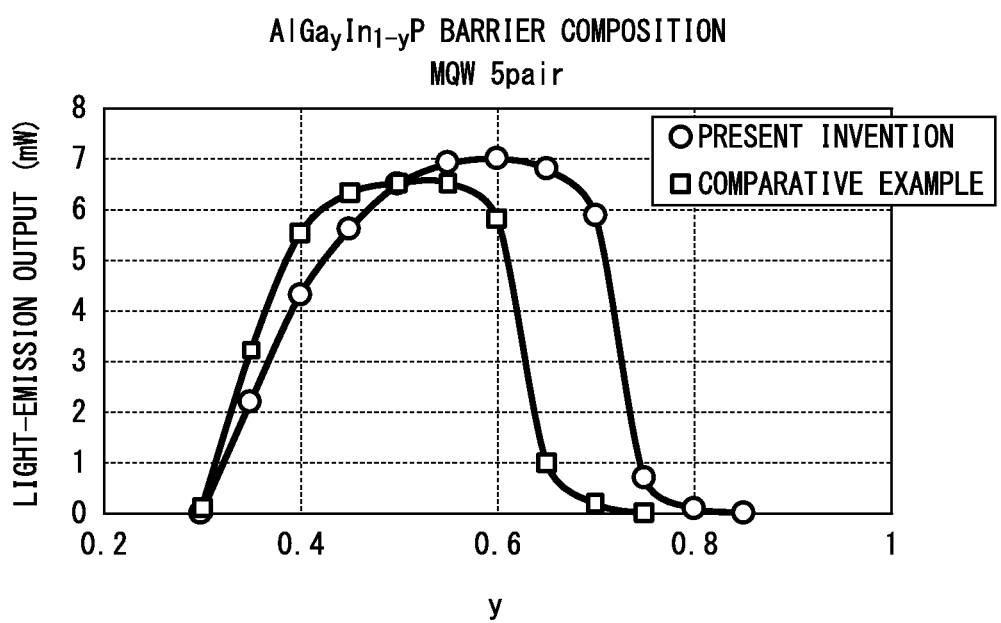
FIG. 11 is a graph illustrating the correlation between an In composition (Y1) of a barrier layer of a light-emitting diode and a light-emission output when AlGaInP is used in a barrier layer of a light-emitting diode according to an embodiment of the invention.
Figure 12:
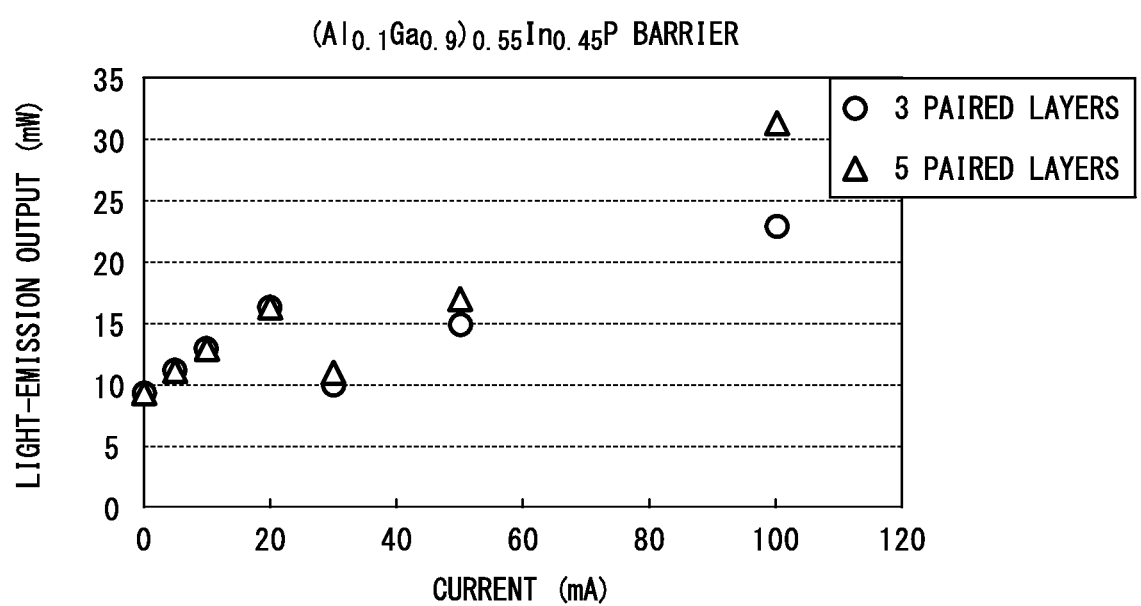
FIG. 12 is a graph illustrating the dependency of the number of paired layers of a well layer and a barrier layer on the correlation between a forward current and a light-emission output of a light-emitting diode when AlGaInP is used in a barrier layer of a light-emitting diode according to an embodiment of the invention.

Next, a method of manufacturing the light-emitting diode 1 of the embodiment will be described. FIG. 8 is a cross-sectional view illustrating an epitaxial wafer used in the light-emitting diode 1 according to this embodiment. FIG. 9 is a cross-sectional view illustrating a bonded wafer used in the light-emitting diode 1 according to this embodiment.

(Process for Forming Compound Semiconductor Layer)

First, as shown in FIG. 8, the compound semiconductor layer 2 is manufactured. The compound semiconductor layer 2 is manufactured by sequentially laminating, on a GaAs substrate 14, a buffer layer 15 made of GaAs, an etching stopper layer (not shown) provided for use in selective etching, a contact layer 16 made of Si-doped n-type AlGaAs, an n-type upper clad layer 13, an upper guide layer 12, an active layer 11, a lower guide layer 10, a p-type lower clad layer 9, and a Mg-doped electric current diffusion layer 8 made of p-type GaP.

As the GaAs substrate 14, a single-crystal substrate which is produced by a known method and is commercially available may be used. It is desirable that the surface to be epitaxially grown of the GaAs substrate 14 be flat and smooth. The surface of the GaAs substrate 14 is readily epitaxially grown with a plane orientation. A substrate having (100) plane mass-produced and a substrate having a surface inclined within ±20° from (100) plane are preferable in terms of stability in quality. Furthermore, in the surface of the GaAs substrate 14 grown epitaxially with a plane orientation, it is more preferable that the substrate have a surface inclined at 15° off ±5° from (100) plane to (0-1-1) plane. In this specification, in regard to the notation of the Miller indexes, "-" means a bar which is attached to the next index.

The GaAs substrate 14 preferably has low dislocation density since the compound semiconductor layer 2 has good crystallinity. As a specific example, the dislocation density thereof is 10,000 per $cm^{-2}$ or less, and preferably 1,000 per $cm^{-2}$ or less.

The GaAs substrate 14 may be n-type or p-type. The carrier concentration of the GaAs substrate 14 may be appropriately selected with respect to the desired electrical conductivity and element structure. For example, when the GaAs substrate 14 is a Si-doped n-type substrate, the carrier concentration thereof is preferably in a range of $1\times10^{17}$ to $5\times10^{18}$ $cm^{-3}$. On the other hand, when the GaAs substrate 14 is a Zn-doped p-type substrate, the carrier concentration thereof is preferably in a range of $2\times10^{18}$ to $5\times10^{19}$ $cm^{-3}$.

The GaAs substrate 14 has a range of appropriate thickness according to the size of the substrate. When the GaAs substrate 14 has a thinner thickness than the range of appropriate thickness, the GaAs substrate 14 may have cracks in a manufacturing process of the compound semiconductor layer 2. On the other hand, the GaAs substrate 14 has a thickness greater than the range of appropriate thickness, it becomes possible to increase costs for a material thereof. Hence, when the GaAs substrate 14 has a large substrate size, for example, when the GaAs substrate 14 has a diameter of 75 mm, the GaAs substrate 14 preferably has a thickness of 250 to 500 μm to prevent cracks during handling. Similarly, when the GaAs substrate 14 has a diameter of 50 mm, the GaAs substrate 14 preferably has a thickness of 200 to 400 μm. When the GaAs substrate 14 has a diameter of 100 mm, the GaAs substrate 14 preferably has a thickness of 350 to 600 μm.

In this way, if the thickness of the substrate becomes greater depending on the size of the GaAs substrate 14, it is possible to reduce warping of the compound semiconductor layer 2 caused by the active layer 7. Accordingly, since a temperature distribution during epitaxial growth becomes uniform, the in-plane wavelength distribution of the active layer 11 can be reduced. The shape of the GaAs substrate 14 is not particularly limited to a circle shape, and the GaAs substrate 14 may be a rectangle or the like.

The buffer layer (buffer) 15 is provided to reduce propagation of defects between the GaAs substrate 14 and layers constituting the light-emitting portion 7. Hence, depending on selection of quality in the substrate and conditions of the epitaxial growth, the buffer layer 15 may not be provided. Further, a material of the buffer layer 15 is preferably the same material as that of the substrate grown epitaxially. Therefore, in the embodiment, similarly to the GaAs substrate 14, GaAs is preferably used in the buffer layer 15. Further, a multilayer film consisting of a material different from that of the GaAs substrate 14 can be used in the buffer layer 15 to reduce propagation of defects. The buffer layer 15 preferably has a thickness of 0.1 μm or more, and more preferably 0.2 μm or more.

The contact layer 16 is provided to reduce the contact resistance with the electrodes. The material of the contact layer 16 is preferably a material which has a band gap greater than the active layer 11, $Al_{X7}Ga_{1-X7}As$, $(Al_{X7}Ga_{1-X7})_{Y4}In_{1-Y4}P$ ($0 \leq X7 \leq 1$, $0 < Y4 \leq 1$) may be appropriately used. Further, the lower limit of the carrier concentration of the contact layer 16 is preferably equal to or higher than $5 \times 10^{17}$ cm$^{-3}$, and more preferably, $1 \times 10^{18}$ cm$^{-3}$ or more, to reduce contact resistance with the electrodes. The upper limit of the carrier concentration thereof is preferably equal to or lower than $2 \times 10^{19}$ cm$^{-3}$. When the carrier concentration thereof is more than the upper limit, the crystallinity thereof is readily decreased. The contact layer 16 preferably has a thickness equal to or greater than 0.5 μm, and most preferably, equal to or greater than 1 μm. The upper limit of the thickness of the contact layer 16 is not particularly limited, but is preferably equal to or smaller than 5 μm since cost for epitaxial growth is in a appropriate range.

In the embodiment, a conventional growing method such as a molecular beam epitaxicy method (MBE) or a low-pressure metal organic chemical vapor deposition method (MOCVD method) can be used. Of these, it is particularly desirable to use a MOCVD method which exhibits excellent mass-productivity. Specifically, the GaAs substrate 14 used in the epitaxial growth of the compound semiconductor layer 2 is preferably subjected to a pretreatment such as a cleaning process and a thermal treatment before the epitaxial growth to remove contamination or a native oxide film on the surface thereof. The GaAs substrate 14 having a diameter of 50 to 150 mm is disposed in MOCVD equipment, and then each layer constituting the above-mentioned compound semiconductor layer 2 can be laminated by the epitaxial growth without removing the GaAs substrate 14 out from the MOCVD equipment. Further, large equipment which is commercially available such as rotation and revolution type equipment and fast rotation type equipment can be used as the MOCVD equipment.

When each layer of the above-mentioned compound semiconductor layer 2 is epitaxially grown, for example, trimethylaluminum (($CH_3)_3Al$), trimethylgallium (($CH_3)_3Ga$), and trimethylindium (($CH_3)_3In$) can be used as the raw materials of constituent elements belonging to Group III. Further, as a raw material for doping Mg, for example, biscyclopentadienyl magnesium (bis-($C_5H_5)_2Mg$) or the like can be used. Furthermore, as a raw material for doping Si, for example, disilane ($Si_2H_6$) or the like can be used.

Moreover, as the raw material of constituent elements belonging to Group V, phosphine ($PH_3$), arsine ($AsH_3$) or the like can be used.

In addition, when p-type GaP is used as the electric current diffusion layer 8, the growth temperature of the electric current diffusion layer 8 may be 720 to 770° C. In the other layers, the growth temperature may be 600 to 700° C.

The carrier concentration and the thickness of each layer, and temperature conditions may be appropriately selected.

The compound semiconductor layer 2 manufactured in the above-described manner has a satisfactory surface state with little crystal defects regardless of the presence of the light-emitting portion 7. Furthermore, the compound semiconductor layer 2 may be subjected to a surface treatment, such as polishing, depending on the element structure.

(Process for Bonding Functional Substrate)

Next, the compound semiconductor layer 2 and the functional substrate 3 are bonded together.

In the bonding of the compound semiconductor layer 2 and the functional substrate 3, first, the surface of the electric current diffusion layer 8 which constitutes the compound semiconductor layer 2 is polished and mirror-finished. Next, the functional substrate 3, which is attached to the mirror-polished surface of the electric current diffusion layer 8, is prepared. The surface of the functional substrate 3 is mirror-polished before being bonded to the electric current diffusion layer 8. Next, the compound semiconductor layer 2 and the functional substrate 3 are carried in a general semiconductor material attachment apparatus, and electrons collide against both mirror-polished surfaces in a vacuum to radiate neutralized Ar beams. Then, the two surfaces overlap each other in the attachment apparatus in a vacuum and a load is applied to the two surfaces. In this way, it is possible to bond the compound semiconductor layer and the transparent substrate at room temperature (see FIG. 7). With respect to the bonding, materials of bonded surfaces are preferably the same as each other in terms of stability of bonding condition.

In regard to the bonding (attachment), although normal-temperature bonding under vacuum is optimal, bonding may be made using a eutectic metal or an adhesive.

(Process for Forming First and Second Electrodes)

Next, the n-type ohmic electrode 4, which is the first electrode, and the p-type ohmic electrode 5, which is the second electrode, are formed.

When forming the n-type ohmic electrode 4 and the p-type ohmic electrode 5, first, the GaAs substrate 14 and the buffer layer 15 are selectively removed from the compound semiconductor layer 2 bonded to the functional substrate 3 by an ammonia-based etchant. Then, the n-type ohmic electrode 4 is formed on the surface of the exposed contact layer 16. Specifically, for example, an AuGe film and a Ni alloy/Pt/Au are formed to have a certain thickness by a vacuum deposition method and are then patterned by a general photolithography method, thereby forming the n-type ohmic electrode 4.

Next, the contact layer 16, the upper clad layer 13, the upper guide layer 12, the active layer 11, the lower guide layer 10, and the p-type lower clad layer 9 are selectively removed within a predetermined range to expose the electric current diffusion layer 8, and the p-type ohmic electrode 5 is formed on the exposed surface of the electric current diffusion layer 8. Specifically, for example, an AuBe/Au film is formed to have a certain thickness by the vacuum deposition method and is then patterned by the general photolithography method, thereby forming the p-type ohmic electrode 5. Then, a heat treatment is performed under the conditions of, for example, a temperature of 400 to 500° C. and a processing time of 5 to 20 minutes, thereby making an alloy. In this way, it is possible to form a low-resistance n-type ohmic electrode 4 and p-type ohmic electrode 5.

(Process for Forming Third Electrode)

When the above-described configuration in which the third electrode (not shown) is provided is introduced, the third electrode is formed on the rear surface of the functional substrate 3. The third electrode may have functions, such as an ohmic electrode, a Schottky electrode, a reflection function, a eutectic die bonding structure, in combination depending on the element structure. On the transparent substrate (functional substrate), a material, such as Au, Ag, or Al, is formed and a structure in which light can be reflected is made. At this time, for example, a transparent film, such as silicon oxide or ITO, may be inserted between the functional substrate and the above material. In this case, as the forming method, known techniques, such as a sputtering method and a vapor deposition method, may be used.

The front surface of the electrode is formed of, for example, a eutectic metal, such as AuSn, a lead-free solder material, or the like, whereby it is not necessary to use paste in a die bonding process, and thus the process can be simplified.

In this case, as the forming method, known techniques, such as a sputtering method, a vapor deposition method, plating, and printing, may be used. In this way, the functional substrate 3 and the n electrode terminal 43 are connected together by the third electrode made of a metal, whereby thermal conductivity is improved and thus the heat dissipation characteristic of the light-emitting diode is improved. When two or more of the above-described functions are used in combination, a method in which a barrier metal oxide is inserted between the layers so as to prevent the diffusion of the metal is preferably used. As the barrier metal oxide, an optimum material may be selected depending on the element structure or the substrate material.

(Process for Finishing Functional Substrate)

Next, the shape of the functional substrate 3 is finished.

In the finishing of the functional substrate 3, first, a V-shaped groove is formed in the surface on which the third electrode (not shown) is not formed. At this time, the inner surface of the V-shaped groove on the third electrode side becomes the inclined surface 3b having an angle α with respect to the plane parallel to the light-emitting surface. Then, the transparent substrate 3 is diced into chips at a predetermined interval from the side of the compound semiconductor layer 2. The vertical surface 3a of the functional substrate 3 is formed by dicing into chips.

A method of forming the inclined surface 3b is not particularly limited. For example, the methods according to the related art, such as a wet etching method, a dry etching method, a scribing method, and a laser processing method, may be combined with each other. It is most preferable to use a dicing method with high shape controllability and high productivity. The use of the dicing method makes it possible to improve manufacturing yield.

A method of forming the vertical surface 3a is not particularly limited. It is preferable that the vertical surface 3a be formed by a laser processing method, a scribing/breaking method or a dicing method. The use of the laser processing method or the scribing/breaking method makes it possible to reduce manufacturing costs. That is, it is not necessary to provide a cutting margin when the substrate is divided into chips and it is possible to manufacture a large number of light-emitting diodes. Therefore, it is possible to reduce manufacturing costs. On the other hand, the use of the dicing method exhibits excellent stability in cutting.

Finally, a fractured layer and contamination are removed by etching using a mixture of sulfuric acid and hydrogen peroxide. In this way, the light-emitting diode 1 is manufactured.

<Method of Manufacturing Light-Emitting Diode Lamp>

Next, a method of manufacturing the light-emitting diode lamp 41 using the above-mentioned light-emitting diode 1, that is, a method of mounting the light-emitting diode 1 will be described.

As shown in FIGS. 1 and 2, a predetermined number of light-emitting diodes 1 are mounted on the surface of the mounting substrate 42. In the mounting of the light-emitting diode 1, first, the light-emitting diode 1 is positioned relative to the mounting substrate 42 and the light-emitting diode 1 is arranged at a predetermined position on the surface of the mounting substrate 42. Then, a die bonding is conducted with Ag paste or the like to fix the light-emitting diode 1 to the surface of the mounting substrate 42. Then, the n-type ohmic electrode 4 of the light-emitting diode 1 is connected to the n electrode terminal 43 of the mounting substrate 42 by the gold wire 45 (wire bonding). Then, the p-type ohmic electrode 5 of the light-emitting diode 1 is connected to the p electrode terminal 44 of the mounting substrate 42 by the gold wire 46. Finally, the surface of the mounting substrate 42 on which the light-emitting diode 1 is mounted is sealed by general seal resin 47, such as silicon resin or epoxy resin. In this way, the light-emitting diode lamp 41 using the light-emitting diode 1 is manufactured.

In regard to the light-emission spectrum of the light-emitting diode lamp 41, since the composition of the active layer 11 is adjusted, the peak light-emission wavelength is in a range of 830 to 1,000 nm. Since variations of the well layer 17 and the barrier layer 18 in the active layer 11 are suppressed by the electric current diffusion layer 8, the half-value width of the light-emission spectrum is in a range of 10 to 40 nm.

As described above, according to the light-emitting diode 1 of this embodiment, the light-emitting portion 7 has the active layer 11 of the quantum well structure in which the well layer 17 made of ternary mixed crystal having a composition formula $(In_{X1}Ga_{1-X1})As$ ($0 \leq X1 \leq 1$) and the barrier layer 18 made of ternary mixed crystal having a composition formula $(Al_{X2}Ga_{1-X2})As$ ($0 \leq X2 \leq 1$) are alternately laminated. In this way, a configuration in which a quantum well structure having a large injected carrier confinement effect is used is made, whereby sufficient injected carriers are confined in the well layer 17. Therefore, the carrier density in the well layer 17 increases, and as a result, the light-emission recombination probability increases and the response speed is improved.

Since the number of paired layers of the well layer 17 and the barrier layer 18 of the quantum well structure is equal to or smaller than five, degradation in the injected carrier confinement effect due to the carrier injected into the quantum well structure expanding over the well layers can be avoided as much as possible, and the high-speed response can be secured.

The upper clad layer 13 and the lower clad layer 9 sandwiching the active layer 11 is made of AlGaInP which is transparent to the light-emission wavelength and has high crystallinity since As, which is likely to cause defects, is not contained. Accordingly, the non-light-emission recombination probability of electrons and holes through defects is reduced, and the light-emission output is improved. As the upper clad layer 13 and the lower clad layer 9, quarternary mixed crystal AlGaInP is introduced, whereby the Al concentration is low and moisture resistance is improved compared to a light-emitting diode in which both the barrier layer and the clad layer are made of ternary mixed crystal.

In the light-emitting diode 1 of this embodiment, the electric current diffusion layer 8 is provided on the light-emitting portion 7. Since the electric current diffusion layer 8 is transparent to the light-emission wavelength, a high-output and high-efficiency light-emitting diode 1 can be obtained without absorbing light emitted from the light-emitting portion 7. The functional substrate is stable in terms of a material, free from corrosion, and excellent in moisture resistance.

Accordingly, according to the light-emitting diode 1 of this embodiment, the conditions of the active layer are adjusted, whereby the light-emitting diode 1 has the light-emission wavelength of 830 to 1,000 nm, is excellent in monochromaticity, achieves high output and high efficiency, and has high moisture resistance. According to the light-emitting diode 1 of this embodiment, it is possible to provide a high-output light-emitting diode 1 having a light-emission output of at least 1.5 times greater than a transparent substrate-type AlGaAs-based light-emitting diode which is manufactured by a liquid phase epitaxial method of the related art and in which a GaAs substrate is not removed.

The light-emitting diode lamp 41 of this embodiment includes the light-emitting diode 1 which is excellent in chromaticity, achieves high output and high efficiency, and has moisture resistance. For this reason, it is possible to provide the light-emitting diode lamp 41 which is suitable for an infrared illumination and a sensor.

Light-Emitting Diode

Second Embodiment

A light-emitting diode according to a second embodiment to which the invention is applied is different from the light-emitting diode according to the first embodiment in that the AlGaAs barrier layer 18 is substituted with a barrier layer made of a compound semiconductor having a composition formula $(Al_{X4}Ga_{1-X4})_{Y2}In_{1-Y2}P$ ($0 \leq X4 \leq 1$, $0 < Y2 \leq 1$).

As described above, the barrier layer 18 which is used in this embodiment is made of a compound semiconductor of quarternary mixed crystal having a composition formula $(Al_{X4}Ga_{1-X4})_{Y2}In_{1-Y2}P$ ($0 \leq X4 \leq 1$, $0 < Y2 \leq 1$).

It is preferable that the Al composition X4 be a composition which makes the band gap greater than the well layer 17, and specifically, in a range of 0 to 0.2.

Y2 is preferably in a range of 0.4 to 0.6 so as to prevent the occurrence of deformation by lattice mismatch with the substrate, and more preferably, in a range of 0.45 to 0.55.

It is preferable that the thickness of the barrier layer 18 be equal to the thickness of the well layer 17 or greater than the thickness of the well layer 17. In this way, the thickness of the barrier layer 18 is sufficiently great in a range of thickness in which the tunnel effect occurs, whereby both the combination of the well layer by the tunnel effect and the suppression of the expansion are supported, whereby the carrier confinement effect can be increased, the light-emission recombination probability of electrons and holes can be increased, and the improvement of the light-emission output can be achieved.

Light-Emitting Diode

Third Embodiment

Figure 13:
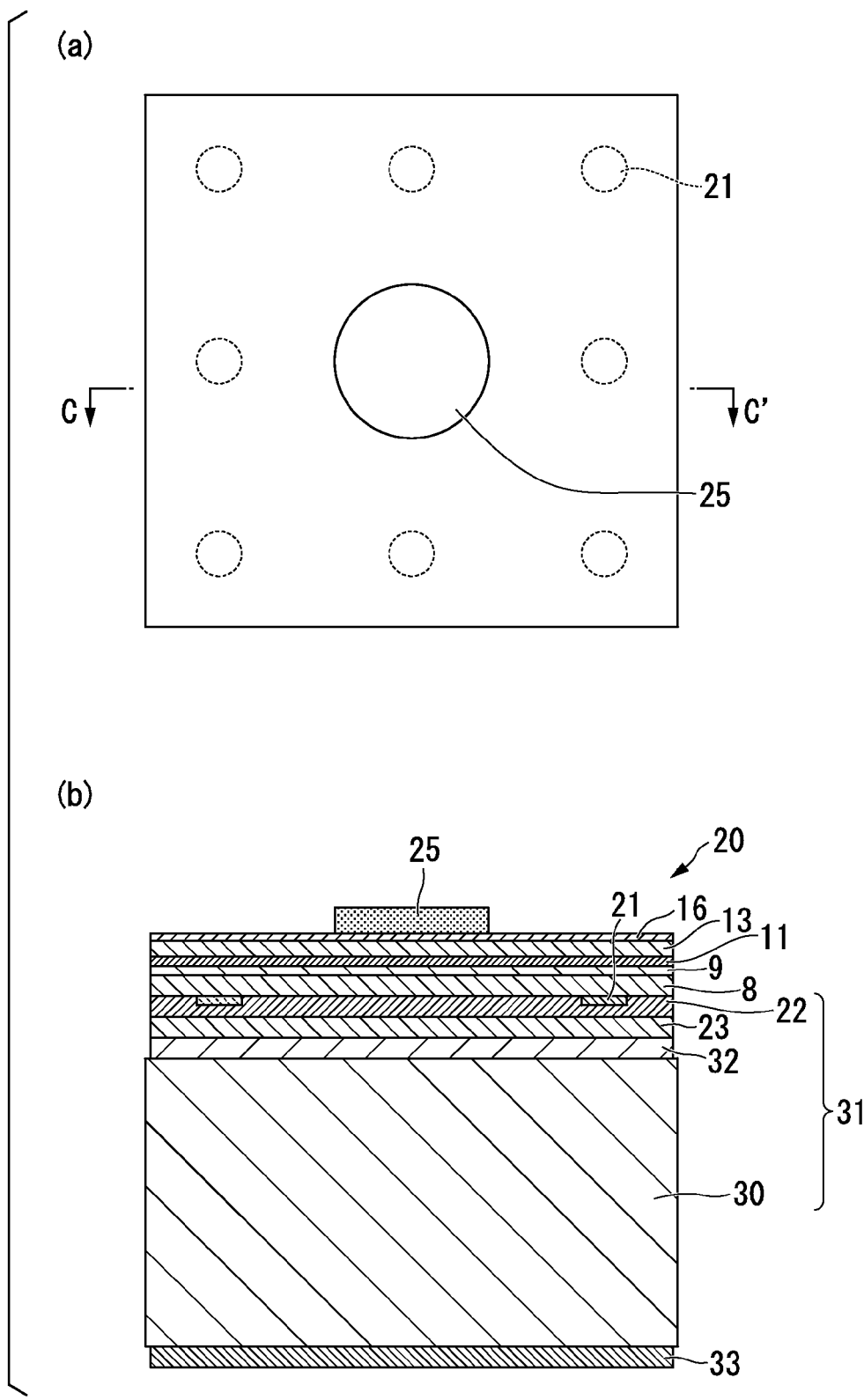
FIG. 13 is a plan view illustrating a light-emitting diode according to another embodiment of the invention, and in particular.

FIGS. 13(*a*) and 13(*b*) are diagrams illustrating a light-emitting diode according to a third embodiment to which the invention is applied. FIG. 13(*a*) is a plan view, and FIG. 13(*b*) is a cross-sectional view taken along the line C-C' of FIG. 13(*a*) (the guide layers 10 and 12 are not shown).

A light-emitting diode 20 according to the third embodiment includes a light-emitting portion 7 which has an active layer 11 of a quantum well structure, in which a well layer 17 made of a compound semiconductor having a composition formula $(In_{X1}Ga_{1-X1})As$ ($0 \leq X1 \leq 1$) and a barrier layer 18 made of a compound semiconductor having a composition formula $(Al_{X2}Ga_{1-X2})As$ ($0 \leq X2 \leq 1$) are alternately laminated, and a lower clad layer (first clad layer) 9 and an upper clad layer (second clad layer) 13 sandwiching the active layer 11, an electric current diffusion layer 8 which is formed on the light-emitting portion 7, and a functional substrate 31 which includes a reflecting layer 23 arranged to face the light-emitting portion 7 and having reflectance equal to or greater than 90% with respect to a light-emission wavelength, and is bonded to the electric current diffusion layer 8. The lower clad layer 9 and the upper clad layer 13 are made of a compound semiconductor having a composition formula $(Al_{X3}Ga_{1-X3})_{Y1}In_{1-Y1}P$ ($0 \leq X3 \leq 1$, $0 < Y1 \leq 1$), and the number of paired layers of the well layer 17 and the barrier layer 18 is equal to or smaller than 5.

The light-emitting diode 20 according to the third embodiment has the functional substrate 31 which includes the reflecting layer 23 arranged to face the light-emitting portion and having reflectance equal to or greater than 90% with respect to the light-emission wavelength, whereby light can be efficiently extracted from the principal light extraction surface.

In the example shown in FIGS. 13(*a*) and 13(*b*), the functional substrate 31 includes a second electrode 21 on a surface 8*b* below the electric current diffusion layer 8. The functional substrate 31 further includes a reflection structure in which a transparent conductive film 22 and the reflecting layer 23 are laminated so as to cover the second electrode 8, and a layer (substrate) 30 which is made of silicon or germanium.

In the light-emitting diode according to the third embodiment, it is preferable that the functional substrate 31 include a layer made of silicon or germanium. This is because silicon or germanium is a corrosion-inhibiting material and thus moisture resistance is improved.

The reflecting layer 23 is made of, for example, silver (Ag), aluminum (Al), gold (Au), an alloy thereof, or the like. These materials have high light reflectance, whereby light reflectance from the reflecting layer 23 can be equal to or greater than 90%.

For the functional substrate 31, a combination in which the reflecting layer 23 is made of a eutectic metal, such as AuIn, AuGe, or AuSn, and is bonded to a cheap substrate (layer), such as silicon or germanium may be used. In particular, AuIn has a low bonding temperature, and is an optimum combination when being bonded to the cheapest silicon substrate (silicon layer) while there is a difference in a thermal expansion coefficient from the light-emitting portion.

The functional substrate 31 may have a configuration in which, for example, a layer made of a high-melting-point metal, such as titanium (Ti), tungsten (W), or platinum (Pt), is inserted so as to prevent diffusion between the electric current diffusion layer, the reflecting layer metal, and the eutectic metal. This configuration is desirable in terms of stability in quality.

Light-Emitting Diode

Fourth Embodiment

Figure 14:
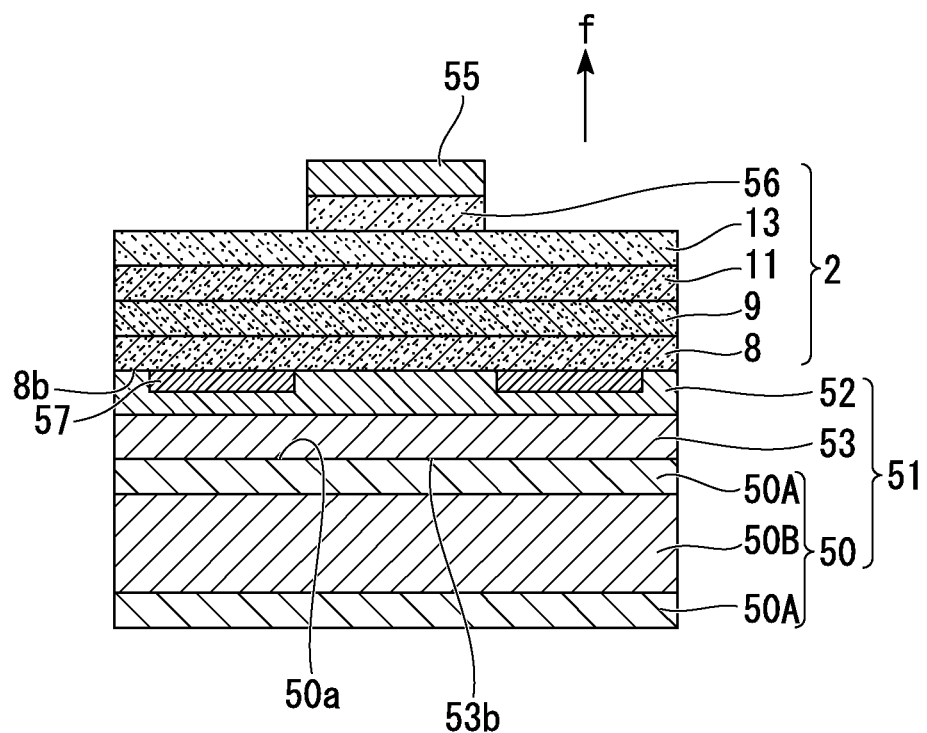
FIG. 14 is a schematic cross-sectional view of a light-emitting diode according to another embodiment of the invention.

FIG. 14 is a diagram illustrating a light-emitting diode according to a fourth embodiment to which the invention is applied.

The light-emitting diode according to the fourth embodiment to which the invention is applied includes a light-emitting portion which has an active layer 11 (see the well layer 17, the barrier layer 18, and the active layer 11 shown in FIG. 5) of a quantum well structure, in which a well layer made of a compound semiconductor having a composition formula $(In_{X1}Ga_{1-X1})As$ ($0 \leq X1 \leq 1$) and a barrier layer made of a compound semiconductor having a composition formula $(Al_{X2}Ga_{1-X2})As$ ($0 \leq X2 \leq 1$) are alternately laminated, and a lower clad layer (first clad layer) 9 and an upper clad layer (second clad layer) 13 sandwiching the active layer 11, an electric current diffusion layer 8 which is formed on the light-emitting portion, and a functional substrate 51 which includes a reflecting layer 53 and a metal substrate 50 arranged to face the light-emitting portion and having reflectance equal to or greater than 90% with respect to a light-emission wavelength, and is bonded to the electric current diffusion layer 8. The lower clad layer 9 and the upper clad layer 13 are made of a compound semiconductor having a composition formula $(Al_{X5}Ga_{1-X5})_{Y3}In_{1-Y3}P$ ($0 \leq X5 \leq 1$, $0<Y3≤1$), and the number of paired layers of the well layer and the barrier layer is equal to or smaller than five.

The light-emitting diode 60 according to the fourth embodiment has a characteristic configuration, in which functional substrate 51 includes the metal substrate 50, compared to the light-emitting diode according to the second embodiment.

The metal substrate 50 has high heat dissipation performance, contributes to light emission of the light-emitting diode with high brightness, and can extend the lifespan of the light-emitting diode.

From the viewpoint of heat dissipation performance, it is preferable that the metal substrate 50 be made of a metal having thermal conductivity equal to or greater than 130 W/m·K. Examples of the metal having thermal conductivity equal to or greater than 130 W/m·K include molybdenum (138 W/m·K) or tungsten (174 W/m·K).

As shown in FIG. 14, the compound semiconductor layer 2 has the active layer 11, the first clad layer (lower clad) 9 and the second clad layer (upper clad) 13 which sandwich the active layer 11 through a guide layer (not shown), the electric current diffusion layer 8 below the first clad layer (lower clad) 9, and a contact layer 56 which is substantially of the same size as a first electrode 55 in plan view above the second clad layer (upper clad) 13.

The functional substrate 51 includes a second electrode 57 on a surface 8b below the electric current diffusion layer 8. The functional substrate 51 further includes a reflection structure in which a transparent conductive film 52 and the reflecting layer 53 are laminated so as to cover the second electrode 57, and the metal substrate 50. A bonding surface 50a of the metal substrate 50 is bonded to a surface 53b of the reflecting layer 53 constituting the reflection structure opposite to the compound semiconductor layer 2.

The reflecting layer 53 is made of, for example, a metal, such as copper, silver, gold, or aluminum, an alloy thereof, or the like. These materials have high light reflectance, whereby light reflectance from the reflection structure can be equal to or greater than 90%. If the reflecting layer 53 is formed, light from the active layer 11 is reflected by the reflecting layer 53 in a front direction f, thereby improving light extraction efficiency in the front direction f. Accordingly, the brightness of the light-emitting diode can be further improved.

It is preferable that the reflecting layer 53 have a laminated structure having Ag, a Ni/Ti barrier layer, and a Au-based eutectic metal (connection metal) from the transparent conductive film 52 side.

The connection metal is a metal which has low electrical resistance and is molten at low temperature. With the use of the connection metal, the metal substrate 50 can be connected without giving heat stress to the compound semiconductor layer 2.

As the connection metal, an Au-based eutectic metal or the like which is chemically stable and has a low melting point is used. Examples of the Au-based eutectic metal include a eutectic composition (Au-based eutectic metal) of an alloy, such as AuSn, AuGe, or AuSi.

In addition, it is preferable to add a metal, such as titanium, chromium, or tungsten, to the connection metal. Accordingly, a metal, such as titanium, chromium, or tungsten, functions as a barrier metal, thereby suppressing the diffusion and reaction of an impurity or the like included in the metal substrate 50 to the reflecting layer 53.

The transparent conductive film 52 is made of an ITO film, an IZO film, or the like. The reflection structure may have only the reflecting layer 53.

Instead of the transparent conductive film 52 or along with the transparent conductive film 52, a so-called cold mirror using a difference in refractive index of a transparent material, for example, a multilayer film of a titanium oxide film and a silicon oxide film, white alumina, or AlN may be used, in combination with the reflecting layer 53.

As the metal substrate 50, a metal substrate having two or more metal layers may be used.

As the configuration of the two or more metal layers, as in the example of FIG. 14, it is preferable that two types of metal layers, that is, a first metal layer 50A and a second metal layer 50B be alternately laminated. In particular, it is more preferable that the number of first metal layers 50A and second metal layers 50B be an odd number in total.

In this case, from the viewpoint of warping or cracking of the metal substrate, when a material having a thermal expansion coefficient smaller than the compound semiconductor layer 2 is used as the second metal layer 50B, it is preferable to use a metal layer made of a metal having a thermal expansion coefficient greater than the compound semiconductor layer 3 as the first metal layer 50A. This is because the thermal expansion coefficient of the entire metal substrate becomes close to the thermal expansion coefficient of the compound semiconductor layer, whereby it is possible to suppress warping or cracking of the metal substrate when bonding the compound semiconductor layer and the metal substrate, and thus to improve production yield of the light-emitting diode.

Similarly, when a material having a thermal expansion coefficient greater than the compound semiconductor layer 2 is used as the second metal layer 50B, it is preferable to use a metal layer made of a material having a thermal expansion coefficient smaller than the compound semiconductor layer 2 as the first metal layer 50A. Similarly to the above, this is also because the thermal expansion coefficient of the entire metal substrate becomes close to the thermal expansion coefficient of the compound semiconductor layer, whereby it is possible to suppress warping or cracking of the metal substrate when bonding the compound semiconductor layer and the metal substrate and thus to improve production yield of the light-emitting diode.

From the above viewpoint, either of the two types of metal layers may be the first metal layer or the second metal layer.

As the two types of metal layers, for example, a combination of a metal layer made of one of silver (thermal expansion coefficient=18.9 ppm/K), copper (thermal expansion coefficient=16.5 ppm/K), gold (thermal expansion coefficient=14.2 ppm/K), aluminum (thermal expansion coefficient=23.1 ppm/K), nickel (thermal expansion coefficient=13.4 ppm/K), and an alloy thereof, and a metal layer made of molybdenum (thermal expansion coefficient=5.1 ppm/K), tungsten (thermal expansion coefficient=4.3 ppm/K), chromium (thermal expansion coefficient=4.9 ppm/K), and an alloy thereof may be used.

A preferred example of the metal substrate 50 includes a metal substrate having three layers of Cu/Mo/Cu. From the above viewpoint, although the same effects are obtained even with the metal substrate having three layers of Mo/Cu/Mo, the metal substrate having three layers of Cu/Mo/Cu has a structure in which Mo having high mechanical strength is sandwiched between Cu which is readily finished, having an advantage of facilitating finishing, such as cutting, compared to a metal substrate having three layers of Mo/Cu/Mo.

For example, the thermal expansion coefficient of the entire metal substrate becomes 6.1 ppm/K in a metal substrate having three layers of Cu (30 μm)/Mo (25 μm)/Cu (30 μm) and becomes 5.7 ppm/K in a metal substrate having three layers of Mo (25 μm)/Cu (70 μm)/Mo (25 μm).

From the viewpoint of heat dissipation, it is preferable that the metal layers constituting the metal substrate be made of materials having high thermal conductivity. Accordingly, heat dissipation performance of the metal substrate increases, whereby the light-emitting diode can emit light with high brightness and the lifespan of the light-emitting diode can be extended.

For example, as the metal substrate, it is preferable to use silver (thermal conductivity=420 W/m·K), copper (thermal conductivity=398 W/m·K), gold (thermal conductivity=320 W/m·K), aluminum (thermal conductivity=236 W/m·K), molybdenum (thermal conductivity=138 W/m·K), tungsten (thermal conductivity=174 W/m·K), and an alloy thereof. It is more preferable that the metal substrate be made of a material such that the thermal expansion coefficient of each metal layer is substantially equal to the thermal expansion coefficient of the compound semiconductor layer. In particular, it is preferable that the material of the metal layer have a thermal expansion coefficient within ±1.5 ppm/K from the thermal expansion coefficient of the compound semiconductor layer. Accordingly, when bonding the metal substrate and the compound semiconductor layer, it is possible to reduce stress by heat to the light-emitting portion, to suppress cracking of the metal substrate by heat when connecting the metal substrate to the compound semiconductor layer, and to improve production yield of the light-emitting diode. For example, the thermal conductivity of the entire metal substrate becomes 250 W/m·K in a metal substrate having three layers of Cu (30 μm)/Mo (25 μm)/Cu (30 μm), and becomes 220 W/m·K in a metal substrate having three layers of Mo (25 μm)/Cu (70 μm)/Mo (25 μm).

Light-Emitting Diode

Fifth Embodiment

A light-emitting diode according to a fifth embodiment to which the invention is applied includes a light-emitting portion 7 which has an active layer 11 of a quantum well structure, in which a well layer 17 made of a compound semiconductor having a composition formula $(In_{X1}Ga_{1-X1})As$ ($0 \leq X1 \leq 1$) and a barrier layer 18 made of a compound semiconductor having a composition formula $(Al_{X4}Ga_{1-X4})_{Y2}In_{1-Y2}P$ ($0 \leq X4 \leq 1$, $0 < Y2 \leq 1$), and lower clad layer (first clad layer) 9 and an upper clad layer (second clad layer) 13 sandwiching the active layer 11, an electric current diffusion layer 8 which is formed on the light-emitting portion 7, and a functional substrate 31 which includes a reflecting layer 23 arranged to face the light-emitting portion 7 and having reflectance equal to or greater than 90% with respect to a light-emission wavelength, and is bonded to the electric current diffusion layer 8. The lower clad layer 9 and the upper clad layer 13 are made of a compound semiconductor having a composition formula $(Al_{X3}Ga_{1-X3})_{Y1}In_{1-Y1}P$ ($0 \leq X3 \leq 1$, $0 < Y1 \leq 1$), and the number of paired layers of the well layer 17 and the barrier layer 18 is equal to or smaller than 5.

The light-emitting diode according to the fifth embodiment has a configuration in which the AlGaAs barrier layer 18 in the light-emitting diode according to the third embodiment is substituted with a barrier layer made of a compound semiconductor having a composition formula $(Al_{X4}Ga_{1-X4})_{Y2}In_{1-Y2}P$ ($0 \leq X4 \leq 1$, $0 < Y2 \leq 1$).

As described above, the barrier layer 18 of this embodiment is made of a compound semiconductor having a composition formula $(Al_{X4}Ga_{1-X4})_{Y2}In_{1-Y2}P$ ($0 \leq X4 \leq 1$, $0 < Y2 \leq 1$).

It is preferable that the Al composition (X4) in the composition formula be a composition which makes the band gap greater than the well layer 17, and specifically, in a range of 0 to 0.2.

Y2 is preferably in a range of 0.4 to 0.6 so as to prevent the occurrence of deformation by lattice mismatch with the substrate, and more preferably, in a range of 0.45 to 0.55.

It is preferable that the thickness of the barrier layer 18 be equal to the thickness of the well layer 17 or be greater than the thickness of the well layer 17. The thickness of the barrier layer 18 is sufficiently great in a range of thickness in which the tunnel effect occurs, whereby both the combination of the well layer by the tunnel effect and the suppression of the expansion are supported, whereby the carrier confinement effect can be increased, the light-emission recombination probability of electrons and holes can be increased, and the improvement of the light-emission output can be achieved.

As in the third embodiment, the light-emitting diode according to this embodiment has the functional substrate which includes the reflecting layer arranged to face the light-emitting portion and having reflectance equal to or greater than 90% with respect to the light-emission wavelength, whereby light can be efficiently extracted from the principal light extraction surface.

In this embodiment, as the functional substrate, the functional substrate illustrated in the third embodiment may be used.

Light-Emitting Diode

Sixth Embodiment

A light-emitting diode according to a sixth embodiment to which the invention is applied includes a light-emitting portion 7 which has an active layer 11 of a quantum well structure, in which a well layer 17 made of a compound semiconductor having a composition formula $(In_{X1}Ga_{1-X1})As$ ($0 \leq X1 \leq 1$) and a barrier layer 18 made of a compound semiconductor layer having a composition formula $(Al_{X4}Ga_{1-X4})_{Y2}In_{1-Y2}P$ ($0 \leq X4 \leq 1$, $0 < Y2 \leq 1$), and a lower clad layer (first clad layer) 9 and an upper clad layer (second clad layer) 13 sandwiching the active layer 11, an electric current diffusion layer 8 which is formed on the light-emitting portion 7, and a functional substrate 51 which includes a reflecting layer 53 and a metal substrate 50 arranged to face the light-emitting portion 7 and having reflectance equal to or greater than 90% with respect to a light-emission wavelength, and is bonded to the electric current diffusion layer 8. The lower clad layer 9 and the upper clad layer 13 are made of compound semiconductor having a composition formula $(Al_{X5}Ga_{1-X5})_{Y3}In_{1-Y3}P$ ($0 \leq X5 \leq 1$, $0 < Y3 \leq 1$), and the number of paired layers of the well layer 17 and the barrier layer 18 is equal to or smaller than 5.

The light-emitting diode according to the sixth embodiment has a configuration in which the AlGaAs barrier layer 18 in the light-emitting diode according to the fourth embodiment is substituted with a barrier layer made of a compound semiconductor having a composition formula $(Al_{X4}Ga_{1-X4})_{Y2}In_{1-Y2}P$ ($0 \leq X4 \leq 1$, $0 < Y2 \leq 1$).

As in the fourth embodiment, the light-emitting diode according to this embodiment has the functional substrate which includes the reflecting layer arranged to face the reflecting layer and having reflectance equal to or greater than 90% with respect to the light-emission wavelength, whereby light can be efficiently extracted from the principal light extraction surface.

In this embodiment, as the functional substrate, the functional substrate illustrated in the fourth embodiment may be used.

EXAMPLES

Hereinafter, the effects of the invention will be described in detail with reference to examples. The invention is not limited to the examples.

In this example, an example in which a light-emitting diode according to the invention is manufactured will be described in detail. A light-emitting diode which is manufactured in this example is an infrared light-emitting diode which has an active layer having a quantum well structure of a well layer made of InGaAs and a barrier layer made of AlGaAs. In this example, a compound semiconductor layer grown on a GaAs substrate and a functional substrate were joined to produce a light-emitting diode. For characteristic evaluation, a light-emitting diode lamp in which a light-emitting diode chip was mounted on a substrate was manufactured.

Example 1

A light-emitting diode of Example 1 is an example of the first embodiment shown in FIGS. 3 and 4, and the bonded area of the well layer and the barrier layer was 123,000 μm² (350 μm×350 μm).

For the light-emitting diode of Example 1, first, a compound semiconductor layer was sequentially laminated on a GaAs substrate made of Si-doped n-type GaAs single crystal to produce an epitaxial wafer having a light-emission wavelength of 920 nm. In the GaAs substrate, a surface inclined at 15° from (100) plane in (0-1-1) direction was a growth surface, and the carrier concentration was $2 \times 10^{18}$ cm$^{-3}$. The thickness of the GaAs substrate was about 0.5 μm. As the compound semiconductor layer, an Si-doped n-type buffer layer made of GaAs, an Si-doped n-type contact layer made of $(Al_{0.7}Ga_{0.3})_{0.5}In_{0.5}P$, an Si-doped n-type upper clad layer made of $(Al_{0.7}Ga_{0.3})_{0.5}In_{0.5}P$, an upper guide layer made of $Al_{0.3}Ga_{0.7}As$, a well layer/barrier layer made of $In_{0.2}Ga_{0.8}As/Al_{0.1}Ga_{0.9}As$, a lower guide layer made of $Al_{0.3}Ga_{0.7}As$, a Mg-doped p-type lower clad layer made of $(Al_{0.7}Ga_{0.3})_{0.5}In_{0.5}P$, a thin-film intermediate layer made of $(Al_{0.5}Ga_{0.5})_{0.5}In_{0.5}P$, and a Mg-doped electric current diffusion layer made of p-type GaP were used.

In this example, a low-pressure metal organic chemical vapor deposition method (MOCVD apparatus) was used, and a compound semiconductor layer was epitaxially grown on a GaAs substrate having a diameter of 76 mm and a thickness of 350 μm to form an epitaxial wafer. When growing the epitaxial layer, as the raw materials for the constituent elements belonging to Group III, trimethylaluminum ($(CH_3)_3Al$), trimethylgallium ($(CH_3)_3Ga$), and trimethylindium ($(CH_3)_3In$) were used. As a raw material for doping Mg, biscyclopentadienyl magnesium (bis-$(C_5H_5)_2Mg$) was used. As a raw material for doping Si, disilane ($Si_2H_6$) was used. As the raw materials belonging to Group V, phosphine ($PH_3$) and arsine ($AsH_3$) were used. As the growth temperature of each layer, the electric current diffusion layer made of p-type GaP was grown at 750° C. The remaining layers were grown at 700° C.

The buffer layer made of GaAs was made to have a carrier concentration of about $2 \times 10^{18}$ cm$^{-3}$ and a thickness of about 0.5 μm. The contact layer was made to have a carrier concentration of about $2 \times 10^{18}$ cm$^{-3}$ and a thickness of about 3.5 μm. The upper clad layer was made to have a carrier concentration of about $1 \times 10^{18}$ cm$^{-3}$ and a thickness of about 0.5 μm. The upper guide layer was made to be undoped and to have a thickness of about 50 nm. The well layer was made to be updoped and made of $In_{0.2}Ga_{0.8}As$ to have a thickness of about 5 nm, and the barrier layer was made to be updoped and made of $Al_{0.1}Ga_{0.9}As$ to have a thickness of about 19 nm. The number of paired layers of the well layer and the barrier layer was one. The lower guide layer was made to be undoped and to have a thickness of about 50 nm. The lower clad layer was made to have a carrier concentration of about $8 \times 10^{17}$ cm$^{-3}$ and a thickness of about 0.5 μm. The intermediate layer was made to have a carrier concentration of about $8 \times 10^{17}$ cm$^{-3}$ and a thickness of about 0.05 μm. The electric current diffusion layer made of GaP was made to have a carrier concentration of about $3 \times 10^{18}$ cm$^{-3}$ and a thickness of about 9 μm.

Next, the electric current diffusion layer was polished to a region having a depth of about 1 μm from the surface and mirror-finished.

With the mirror finishing, roughness (root-mean-square: rms) of the surface of the electric current diffusion layer was 0.18 nm.

A functional substrate made of n-type GaP to be attached to the mirror-finished surface of the electric current diffusion layer was prepared. The attachment functional substrate was added with Si such that the carrier concentration became about $2 \times 10^{17}$ cm$^{-3}$, and single crystal with the plan orientation (111) was used. The diameter of the functional substrate was 76 mm, and the thickness of the functional substrate was 250 μm. The surface of the functional substrate was mirror-polished before being bonded to the electric current diffusion layer, and surface roughness was finished to 0.12 nm by root-mean-square (rms).

Next, the functional substrate and the epitaxial wafer were carried in a general semiconductor material attachment apparatus, and the apparatus was evacuated to $3 \times 10^{-5}$ Pa.

Next, electrons were collided against the surfaces of both the functional substrate and the electric current diffusion layer to radiate a neutralized Ar beam for three minutes. Thereafter, in the attachment apparatus under vacuum, the surfaces of the functional substrate and the electric current diffusion layer overlapped each other, a load was applied such that the pressure on each surface became 50 g/cm², and both the functional substrate and the electric current diffusion layer were bonded at room temperature. In this way, a bonded wafer was formed.

Then, the GaAs substrate and the GaAs buffer layer were selectively removed from the bonded wafer by an ammonia-based etchant. Next, as a first electrode on the surface of the contact layer, AuGe and a Ni alloy having a thickness of 0.5 μm, Pt having a thickness of 0.2 μm, and Au having a thickness of 1 μm were formed by a vacuum deposition method. Thereafter, patterning was performed using a general photolithography method to form an n-type ohmic electrode as the first electrode. Next, a surface roughening treatment was performed on the surface of the light extraction surface on which the GaAs substrate was removed.

Next, as a second electrode, an epitaxial layer corresponding to a region for forming a p-type ohmic electrode was selectively removed to expose the electric current diffusion layer. A p-type ohmic electrode was formed on the exposed surface of the electric current diffusion layer by a vacuum deposition method such that AuBe was made to have a thickness of 0.2 μm and Au was made to have a thickness of 1 μm. Then, a heat treatment was performed at a temperature of 450° C. for 10 minutes to change the electrode into an alloy. In this way, low-resistance p-type and n-type ohmic electrodes were formed. Au was formed on the rear surface of the functional substrate to have a thickness of 0.2 μm, and a pattern was formed in a square shape, the side of which being 230 µm, to form a third electrode.

Next, a V-shaped groove was formed in a region where the third electrode is not formed from the rear surface of the functional substrate using a dicing saw such that the angle α of the inclined surface became 70° and the thickness of the vertical surface became 130 µm. Then, the transparent substrate was cut into chips at an interval of 350 µm from the compound semiconductor layer by a dicing saw. A fractured layer and contamination caused by dicing were removed by etching using a mixture of sulfuric acid and hydrogen peroxide. In this way, the light-emitting diode according to Example 1 was manufactured.

100 light-emitting diode lamps in which a light-emitting diode chip of Example 1 manufactured in the above-described manner was mounted on a mounting substrate were assembled. The light-emitting diode lamp was manufactured by supporting (mounting) a mount with a die bonder, wire-bonding the n-type ohmic electrode of the light-emitting diode and the n electrode terminal provided on the surface of the mounting substrate with a gold wire, wire-bonding the p-type ohmic electrode and the p electrode terminal with a gold wire, and sealing with general epoxy resin.

Figure 15:
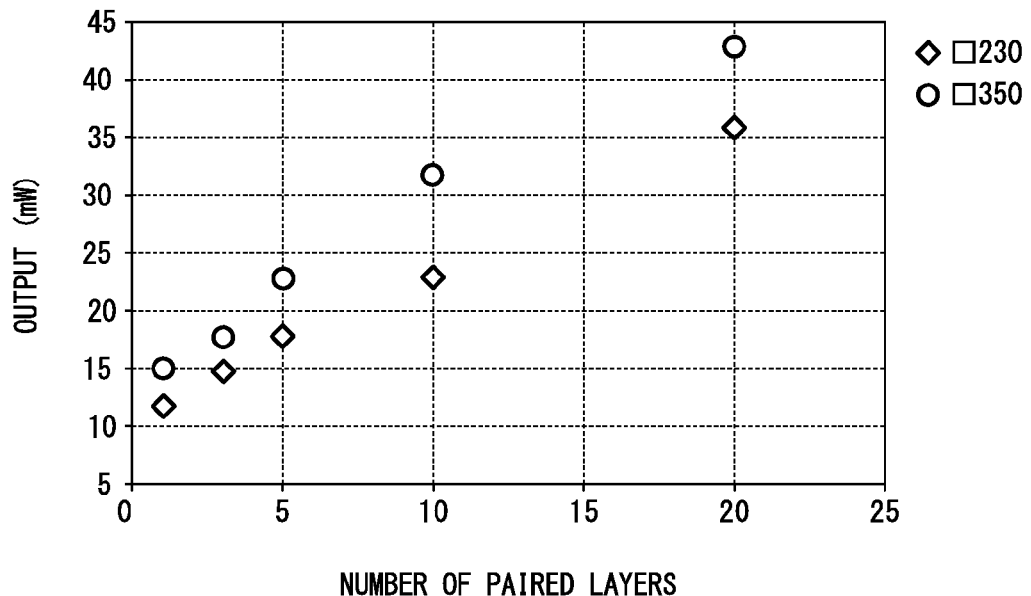
FIG. 15 is a graph illustrating the relationship between the number of paired layers and a response speed when AlGaAs is used in a barrier layer of a light-emitting diode according to an embodiment of the invention, and when a bonded area is 123,000 $\mu m^2$ and 53,000 $\mu m^2$.
Figure 16:
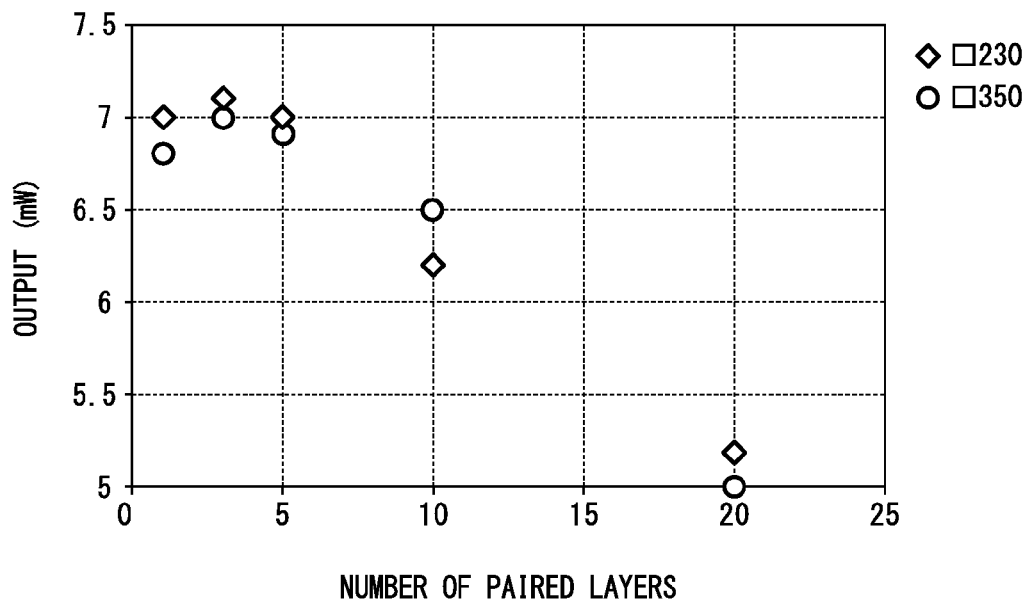
FIG. 16 is a graph illustrating the relationship between the number of paired layers and a light-emission output when AlGaAs is used in a barrier layer of a light-emitting diode according to an embodiment of the invention, and when a bonded area is 123,000 $\mu m^2$ and 53,000 $\mu m^2$.

The evaluation result of the characteristics of the light-emitting diode (light-emitting diode lamp) is shown in Tables 5, 15, and 16. FIG. 15 is a graph showing the relationship between the number of paired layers and the response speed when the barrier layer is made of a compound semiconductor having a composition formula $(Al_{X2}Ga_{1-X2})As$ ($0 \leq X2 \leq 1$), and the bonded area of the active layer and the clad layer is 123,000 µm² and 53,000 µm². FIG. 16 is a graph showing the relationship between the number of paired layers and the light-emission output under the same conditions as in FIG. 15.

In Example 1, when a current flows between the n-type and p-type ohmic electrodes, infrared light having the peak light-emission wavelength of 920 nm was emitted. As shown in Table 5, in Example 1, a forward voltage (Vf) when a current of 20 milliampere (mA) flowed in a forward direction reflected low resistance at the bonding interface of the electric current diffusion layer constituting the compound semiconductor layer and the functional substrate, and satisfactory ohmic characteristics of each ohmic electrode, and became 1.2 volt. The response speed (rising time) Tr and the light-emission output ($P_0$) when the forward current was 20 mA were respectively 15 nsec and 6.8 mW.

Example 2

A light-emitting diode of Example 2 is an example of the first embodiment. This light-emitting diode was manufactured and evaluated under the same conditions as in Example 1 except that the number of paired layers of the well layer and the barrier layer was three.

As a result, the response speed (Tr), the light-emission output ($P_0$), and the forward voltage ($V_F$) were respectively 18 nsec, 7.0 mW, and 1.2 V.

Example 3

A light-emitting diode of Example 3 is an example of the first embodiment. This light-emitting diode was manufactured and evaluated under the same conditions as in Example 1 except that the number of paired layers of the well layer and the barrier layer was five.

As a result, the response speed (Tr), the light-emission output ($P_0$), and the forward voltage ($V_F$) were respectively 23 nsec, 6.9 mW, and 1.22 V.

TABLE 5

| | Element Structure | Substrate | Bonded Area (µm²) | Barrier Layer | Number of Paired Layers | Tr (nsec) | $P_0$ (20 mA) | $V_F$ (20 mA) |
|---|---|---|---|---|---|---|---|---|
| Example 1 | Transparent | GaP | 123000 | AlGaAs | 1 | 15 | 6.8 | 1.20 |
| Example 2 | Transparent | GaP | 123000 | AlGaAs | 3 | 18 | 7.0 | 1.20 |
| Example 3 | Transparent | GaP | 123000 | AlGaAs | 5 | 23 | 6.9 | 1.22 |
| Example 4 | Transparent | GaP | 53000 | AlGaAs | 1 | 12 | 7.0 | 1.25 |
| Example 5 | Transparent | GaP | 53000 | AlGaAs | 3 | 15 | 7.1 | 1.26 |
| Example 6 | Transparent | GaP | 53000 | AlGaAs | 5 | 18 | 7.0 | 1.30 |
| Example 7 | Transparent | GaP | 20000 | AlGaAs | 5 | 14 | 7.0 | 1.36 |
| Example 8 | Transparent | GaP | 20000 | AlGaAs | 3 | 12 | 7.0 | 1.35 |
| Example 9 | Transparent | GaP | 90000 | AlGaAs | 5 | 21 | 6.9 | 1.23 |
| Example 10 | Transparent | GaP | 90000 | AlGaAs | 3 | 16 | 7.0 | 1.22 |
| Example 11 | Transparent | GaP | 123000 | AlGaInP | 5 | 24 | 6.7 | 1.26 |
| Example 12 | Transparent | GaP | 123000 | AlGaInP | 3 | 18 | 6.8 | 1.24 |
| Example 13 | Transparent | GaP | 53000 | AlGaInP | 3 | 14 | 6.8 | 1.29 |
| Example 14 | Reflective | Si | 123000 | AlGaAs | 5 | 24 | 6.5 | 1.24 |
| Example 15 | Reflective | Si | 123000 | AlGaAs | 3 | 20 | 6.7 | 1.24 |
| Example 16 | Reflective | Si | 53000 | AlGaAs | 3 | 15 | 6.5 | 1.28 |
| Example 17 | Reflective | Si | 123000 | AlGaInP | 5 | 24 | 6.4 | 1.26 |
| Example 18 | Reflective | Si | 123000 | AlGaInP | 3 | 20 | 6.5 | 1.25 |
| Example 19 | Reflective | Si | 53000 | AlGaInP | 3 | 15 | 6.5 | 1.29 |
| Example 20 | Reflective | Metal | 123000 | AlGaAs | 5 | 25 | 6.6 | 1.27 |
| Example 21 | Reflective | Metal | 123000 | AlGaAs | 3 | 20 | 6.7 | 1.27 |
| Example 22 | Reflective | Metal | 123000 | AlGaInP | 5 | 25 | 6.4 | 1.31 |
| Example 23 | Reflective | Metal | 123000 | AlGaInP | 3 | 21 | 6.5 | 1.30 |
| Comparative Example 1 | Liquid-phase epitaxial | AlGaAs | | AlGaAs | | 1700 | 2.0 | 1.20 |
| Reference Example 1 | Transparent | GaP | 123000 | AlGaAs | 10 | 32 | 6.5 | 1.32 |
| Reference Example 2 | Transparent | GaP | 123000 | AlGaAs | 20 | 43 | 5.0 | 1.38 |
| Reference Example 3 | Transparent | GaP | 53000 | AlGaAs | 10 | 23 | 6.2 | 1.40 |
| Reference Example 4 | Transparent | GaP | 53000 | AlGaAs | 20 | 36 | 5.2 | 1.51 |

Although light-emitting diodes of Examples 4 to 6 described below are examples of the first embodiment, these examples are different to Example 1 or the like in that the bonded area of the active layer and the clad layer was 53,000 $\mu m^2$ (230 $\mu m \times 230$ $\mu m$).

Example 4

A light-emitting diode of Example 4 was manufactured and evaluated under the same conditions as in Example 1 except for the bonded area of the active layer and the clad layer.
As a result, the response speed (Tr), the light-emission output ($P_O$), and the forward voltage ($V_F$) were respectively 12 nsec, 7.0 mW, and 1.25 V.

Example 5

A light-emitting diode of Example 5 was manufactured and evaluated under the same conditions as in Example 4 except that the number of paired layers of the well layer and the barrier layer was three.
As a result, the response speed (Tr), the light-emission output ($P_O$), and the forward voltage ($V_F$) were respectively 15 nsec, 7.1 mW, and 1.26 V.

Example 6

A light-emitting diode of Example 6 was manufactured and evaluated under the same conditions as in Example 4 except that the number of paired layers of the well layer and the barrier layer was five.
As a result, the response speed (Tr), the light-emission output ($P_O$), and the forward voltage ($V_F$) were respectively 18 nsec, 7.0 mW, and 1.30 V.

Example 7

Although a light-emitting diode of Example 7 is an example of the first embodiment, in this example, the bonded area of the active layer and the clad layer was 20,000 $\mu m^2$ (200 $\mu m \times 100$ $\mu m$).
A light-emitting diode of Example 7 was manufactured and evaluated under the same conditions as in Example 1 except for the bonded area of the active layer and the clad layer.
As a result, the response speed (Tr), the light-emission output ($P_O$), and the forward voltage ($V_F$) were respectively 14 nsec, 7.0 mW, and 1.36 V.

Example 8

Although a light-emitting diode of Example 8 is an example of the first embodiment, this light-emitting diode was manufactured and evaluated under the same conditions as in Example 7 except that the number of paired layers of the well layer and the barrier layer was three.
As a result, the response speed (Tr), the light-emission output ($P_O$), and the forward voltage ($V_F$) were respectively 12 nsec, 7.0 mW, and 1.35 V.

Example 9

Although a light-emitting diode of Example 9 is an example of the first embodiment, in this example, the bonded area of the active layer and the clad layer was 90,000 $\mu m^2$ (300 $\mu m \times 300$ $\mu m$).

A light-emitting diode of Example 9 was manufactured and evaluated under the same conditions as in Example 1 except for the bonded area of the active layer and the clad layer.
As a result, the response speed (Tr), the light-emission output ($P_O$), and the forward voltage ($V_F$) were respectively 21 nsec, 6.9 mW, and 1.23 V.

Example 10

Although a light-emitting diode of Example 10 is an example of the first embodiment, this light-emitting diode was manufactured and evaluated under the same conditions as in Example 9 except that the number of paired layers of the well layer and the barrier layer was three.
As a result, the response speed (Tr), the light-emission output ($P_O$), and the forward voltage ($V_F$) were respectively 16 nsec, 7.0 mW, and 1.22 V.

Light-emitting diodes of Examples 11 to 13 described below are examples of the second embodiment.

Example 11

A light-emitting diode of Example 11 is an example where the bonded area of the active layer and the clad layer is 123,000 $\mu m^2$ (350 $\mu m \times 350$ $\mu m$), and the light-emission wavelength is 960 nm.
The layer configuration of the light-emitting diode of Example 11 is as follows.
In Example 11, on a Si-doped GaAs substrate made of n-type GaAs single crystal, a surface inclined at 15° from (100) plane in (0-1-1) direction was a growth surface, and the carrier concentration was $2 \times 10^{18}$ $cm^{-3}$. As the compound semiconductor layer, a Si-doped n-type buffer layer made of GaAs, Si-doped n-type contact layer made of $(Al_{0.7}Ga_{0.3})_{0.5}In_{0.5}P$, a Si-doped n-type upper clad layer made of $(Al_{0.3}Ga_{0.7})_{0.5}In_{0.5}P$, an upper guide layer made of $(Al_{0.1}Ga_{0.9})_{0.5}In_{0.5}P$, a well layer/barrier layer made of $In_{0.25}Ga_{0.75}As/(Al_{0.1}Ga_{0.9})_{0.5}In_{0.5}P$, a lower guide layer made of $(Al_{0.1}Ga_{0.9})_{0.5}In_{0.5}P$, a Mg-doped p-type lower clad layer made of $(Al_{0.3}Ga_{0.7})_{0.5}In_{0.5}P$, a thin-film intermediate layer made of $(Al_{0.5}Ga_{0.5})_{0.5}In_{0.5}P$, and a Mg-doped electric current diffusion layer made of p-type GaP were used.
The buffer layer made of GaAs was made to have a carrier concentration of about $2 \times 10^{18}$ $cm^{-3}$ and a thickness of about 0.5 $\mu m$. The contact layer was made to have a carrier concentration of about $2 \times 10^{18}$ $cm^{-3}$ and a thickness of about 3.5 $\mu m$. The upper clad layer was made to have a carrier concentration of about $1 \times 10^{18}$ $cm^{-3}$ and a thickness of about 0.5 $\mu m$. The upper guide layer was made to be undoped and to have a thickness of about 50 nm. The well layer was made to be undoped and made of $In_{0.25}Ga_{0.75}As$ to have a thickness of about 5 nm, and the barrier layer was made to be undoped and made of $(Al_{0.1}Ga_{0.9})_{0.5}In_{0.5}P$ to have a thickness of 19 nm. The number of paired layers of the well layer and the barrier layer was five. The lower guide layer was made to be undoped and to have a thickness of about 50 nm. The lower clad layer was made to have a carrier concentration of about $8 \times 10^{17}$ $cm^{-3}$ and a thickness of about 0.5 $\mu m$. The intermediate layer was made to have a carrier concentration of about $8 \times 10^{17}$ $cm^{-3}$ and a thickness of about 0.05 $\mu m$. The electric current diffusion layer made of GaP was made to have a carrier concentration of about $3 \times 10^{18}$ $cm^{-3}$ and a thickness of about 9 $\mu m$.
In the light-emitting diode of Example 11, the response speed (Tr), the light-emission output ($P_O$), and the forward voltage ($V_F$) were respectively 24 nsec, 6.7 mW, and 1.26 V.

Example 12

Although a light-emitting diode of Example 12 is an example of the second embodiment, this light-emitting diode was manufactured and evaluated under the same conditions as in Example 11 except that the number of paired layers of the well layer and the barrier layer was three.

As a result, the response speed (Tr), the light-emission output ($P_O$), and the forward voltage ($V_F$) were respectively 18 nsec, 6.8 mW, and 1.24 V.

Example 13

A light-emitting diode of Example 13 was manufactured and evaluated under the same conditions as in Example 11 except that the bonded area of the active layer and the clad layer was 53,000 $\mu m^2$ (230 $\mu m \times 230$ $\mu m$), and the number of paired layers of the well layer and the barrier layer was three.

As a result, the response speed (Tr), the light-emission output ($P_O$), and the forward voltage ($V_F$) were respectively 14 nsec, 6.8 mW, and 1.29 V.

As in Examples 1 to 13, Examples 14 to 19 described below are examples where a compound semiconductor layer is produced, a functional substrate including a reflecting layer is bonded to an electric current diffusion layer, and the functional substrate includes a layer made of silicon. Here, light-emitting diodes of Examples 14 to 16 are examples of the third embodiment, and light-emitting diodes of Examples 17 to 19 are examples of the fifth embodiment.

Example 14

A light-emitting diode of Example 14 is an example where the bonded area of the active layer and the clad layer is 123,000 $\mu m^2$ (350 $\mu m \times 350$ $\mu m$), and a compound semiconductor layer is manufactured by the same procedure as in Example 1 or the like, and a functional substrate including a reflecting layer is bonded to an electric current diffusion layer. At this time, the number of paired layers of the well layer and the barrier layer was five.

Hereinafter, a method of manufacturing the light-emitting diode of Example 14 will be described with reference to FIGS. 13(a) and 13(b).

First, eight electrodes (second electrode) 21 which were 20 $\mu m \phi$ dots formed of AuBe/Au alloy to have a thickness of 0.2 $\mu m$ were arranged on the surface of the electric current diffusion layer 8 at regular intervals so as to become 50 $\mu m$ from the end of the light extraction surface.

Next, an ITO film 22 serving as a transparent conductive film was formed to have a thickness of 0.4 $\mu m$ by a sputtering method. A layer 23 made of silver alloy/Ti/Au was formed to have a thickness of 0.2 $\mu m$/0.1 $\mu m$/1 $\mu m$, whereby the reflecting layer 23 was formed.

A layer 32 made of Ti/Au/In was formed on the surface of a silicon substrate 30 to have a thickness of 0.1 $\mu m$/0.5 $\mu m$/0.3 $\mu m$. A layer 33 made of Ti/Au was formed on the rear surface of the silicon substrate 30 to have a thickness of 0.1 $\mu m$/0.5 $\mu m$. Au on the light-emitting diode wafer side and the In surface of the silicon substrate side overlapped each other, heated at 320° C. and pressed at 500 g/cm², whereby the functional substrate including the silicon substrate was bonded to the light-emitting diode wafer.

Next, the GaAs substrate was removed, an ohmic electrode (first electrode) 25 was formed of AuGe/Au on the surface of the contact layer 16 to have a diameter of 100 $\mu m$ and a thickness of 3 $\mu m$, and a heat treatment was performed at 420° C. for five minutes, whereby the p and n ohmic electrodes were alloyed.

Next, the contact layer 16 other than the contact layer 16 masked with the electrode 25 was removed using the first electrode 25 as a mask, and the surface was subjected to a surface roughening treatment.

Next, the semiconductor layer, the reflecting layer, and the eutectic metal in a portion to be cut when dividing into chips were removed, and the silicon substrate 31 was cut in a square shape at 350 $\mu m$ pitch by a dicing saw.

As to the light-emitting diode (light-emitting diode lamp) obtained in the above-described manner, when a current flowed between the electrodes on the upper surface and the lower surface, infrared light having a peak wavelength of 920 nm was emitted. A forward voltage (Vf) when a current of 20 milliampere (mA) flowed in a forward direction reflected low resistance at the bonding interface of the electric current diffusion layer constituting the compound semiconductor layer and the functional substrate, and satisfactory ohmic characteristics of each ohmic electrode, and the response speed (Tr), the light-emission output ($P_O$), and the forward voltage ($V_F$) were respectively 24 nsec, 6.5 mW, and 1.24 V.

Example 15

Although a light-emitting diode of Example 15 is an example of the third embodiment, this light-emitting diode was manufactured and evaluated under the same conditions as in Example 14 except that the number of paired layers of the well layer and the barrier layer was three.

As a result, the response speed (Tr), the light-emission output ($P_O$), and the forward voltage ($V_F$) were respectively 20 nsec, 6.7 mW, and 1.24 V.

Example 16

A light-emitting diode of Example 16 was manufactured and evaluated under the same conditions as in Example 11 except that the bonded area of the active layer and the clad layer was 53,000 $\mu m^2$ (230 $\mu m \times 230$ $\mu m$), and the number of paired layers of the well layer and the barrier layer was three.

As the result of evaluating the characteristics of the light-emitting diode (light-emitting diode lamp), the response speed (Tr), the light-emission output ($P_O$), and the forward voltage ($V_F$) were respectively 15 nsec, 6.5 mW, and 1.28 V.

Example 17

A light-emitting diode of Example 17 is an example where the bonded area of the active layer and the clad layer is 123,000 $\mu m^2$ (350 $\mu m \times 350$ $\mu m$), and the number of paired layers of the well layer and the barrier layer is five. The light-emitting diode of Example 17 has a configuration in which a compound semiconductor layer is produced by the same procedure as in Example 11, and a functional substrate including a reflecting layer is then bonded to an electric current diffusion layer by the same procedure as in Example 14.

As the result of evaluating the characteristics of the light-emitting diode (light-emitting diode lamp), the response speed (Tr), the light-emission output ($P_O$), and the forward voltage ($V_F$) were respectively 24 nsec, 6.4 mW, and 1.26 V.

Example 18

Although a light-emitting diode of Example 18 is an example of the fifth embodiment, this light-emitting diode was manufactured and evaluated under the same conditions as in Example 17 except that the number of paired layers of the well layer and the barrier layer was three.

As a result, the response speed (Tr), the light-emission output ($P_0$), and the forward voltage ($V_F$) were respectively 20 nsec, 6.5 mW, and 1.25 V.

Example 19

A light-emitting diode of Example 19 was manufactured and evaluated under the same conditions as in Example 13 except that the bonded area of the active layer and the clad layer was 53,000 $\mu m^2$ (230 $\mu m \times 230$ $\mu m$), and the number of paired layers of the well layer and the barrier layer was three.

As a result, the response speed (Tr), the light-emission output ($P_0$), and the forward voltage ($V_F$) were respectively 15 nsec, 6.5 mW, and 1.29 V.

Examples 20 and 21 described below are examples of the fourth embodiment, Examples 22 and 23 are examples of the sixth embodiment, and as in Examples 1 to 13, a compound semiconductor layer is manufactured, and a functional substrate including a reflecting layer and a metal substrate is bonded to an electric current diffusion layer.

Example 20

A light-emitting diode of Example 20 is an example where the bonded area of the active layer and the clad layer is 123,000 $\mu m^2$ (350 $\mu m \times 350$ $\mu m$), and the number of paired layers of the well layer and the barrier layer is five. A method of manufacturing the light-emitting diode of Example 20 will be described with reference to FIG. 14.

First, eight second electrodes 57 which were 20 $\mu m \phi$ dots formed of AuBe/Au alloy to have a thickness of 0.2 $\mu m$ were arranged on the surface 8b of the electric current diffusion layer 8 at regular intervals so as to become 50 $\mu m$ from the end of the light extraction surface.

Next, an ITO film 52 serving as a transparent conductive film was formed to have a thickness of 0.4 $\mu m$ by a sputtering method. A layer 53 made of silver alloy/Ti/Au was formed to have a thickness of 0.2 $\mu m$/0.1 $\mu m$/1 $\mu m$, whereby the reflecting layer 53 was formed.

Next, first metal plates 50A and 50A made of a material having a thermal expansion coefficient greater than the material of the compound semiconductor layer 2, and a second metal plate 50B made of a material having a thermal expansion coefficient smaller than the material of the compound semiconductor layer 2 were introduced, and the metal substrate 50 was formed by hot pressing. Specifically, Cu having a thickness of 10 $\mu m$ was used as the first metal plate 50A, and Mo having a thickness of 75 $\mu m$ was sued as the second metal plate 50B. Then, as shown in FIG. 14, the second metal plate 50B was inserted between the two first metal plates 50A and 50A, and a load was applied at high temperature by a predetermined pressing apparatus in a state where these metal plates overlap each other, whereby the metal substrate 50 having three layer of Cu (10 $\mu m$)/Mo (75 $\mu m$)/Cu (10 $\mu m$) was formed.

Next, the surface of the reflecting layer 53 of the light-emitting diode and the metal substrate 50 overlapped each other, and bonding was made through heating at 400° C. and pressing at 500 g/cm², whereby a light-emitting diode wafer with the functional substrate 51 bonded was manufactured.

Next, the GaAs substrate was removed, an ohmic electrode 55 was formed of AuGe/Au on the surface of the contact layer 56 to have a diameter of 100 $\mu m$ and a thickness of 3 $\mu m$, a heat treatment was performed at 420° C. for five minutes, whereby the p and n ohmic electrode were alloyed.

Next, the contract layer 16 other than the contact layer 16 masked with the electrode 25 was removed using the first electrode 25 as a mask, and the surface was subjected to a surface roughening treatment.

The semiconductor layer, the reflecting layer, and the eutectic metal in a portion to be cut when dividing into chips were removed, and the silicon substrate was cut in a square shape at 350 $\mu m$ pitch by a dicing saw.

As the result of evaluating the characteristics of the light-emitting diode (light-emitting diode lamp), the response speed (Tr), the light-emission output ($P_0$), and the forward voltage ($V_F$) were respectively 25 nsec, 6.6 mW, and 1.27 V.

Example 21

Although a light-emitting diode of Example 21 is an example of the fourth embodiment, this light-emitting diode was manufactured and evaluated under the same conditions as in Example 20 except that the number of paired layers of the well layer and the barrier layer was three.

As a result, the response speed (Tr), the light-emission output ($P_0$), and the forward voltage ($V_F$) were respectively 20 nsec, 6.7 mW, and 1.27 V.

Example 22

A light-emitting diode of Example 22 is different from the light-emitting diode of Example 20 in that the AlGaAs barrier layer is substituted with a barrier layer made of a compound semiconductor having a composition formula ($Al_{X4}Ga_{1-X4}$)$_{Y2}In_{1-Y2}$P ($0 \leq X4 \leq 1$, $0 < Y2 \leq 1$).

As the result of evaluating the characteristics of the light-emitting diode (light-emitting diode lamp), the response speed (Tr), the light-emission output ($P_0$), and the forward voltage ($V_F$) were respectively 25 nsec, 6.4 mW, and 1.31 V.

Example 23

Although a light-emitting diode of Example 23 is an example of the sixth embodiment, this light-emitting diode was manufactured and evaluated under the same conditions as in Example 22 except that the number of paired layers of the well layer and the barrier layer was three.

As a result, the response speed (Tr), the light-emission output ($P_0$), and the forward voltage ($V_F$) were respectively 21 nsec, 6.5 mW, and 1.30 V.

Reference Examples 1 to 4 are examples where the number of paired layers of the well layer and the barrier layer is 10 and 20, and shows that a configuration in which the quantum well structure of ternary mixed crystal of the invention or the quantum well structure having the ternary mixed crystal well layer and the quarternary mixed crystal barrier layer is sandwiched between quarternary clad layers is appropriate for a high light-emission output.

Reference Example 1

A light-emitting diode of Reference Example 1 was manufactured and evaluated under the same conditions as the light-emitting diode of Example 1 except that the number of paired layers of the well layer and the barrier layer was 10.

As the result of evaluating the characteristics of the light-emitting diode (light-emitting diode lamp), the response speed (Tr), the light-emission output ($P_O$), and the forward voltage ($V_F$) were respectively 32 nsec, 6.5 mW, and 1.32 V.

Reference Example 2

A light-emitting diode of Reference Example 2 was manufactured and evaluated under the same conditions as the light-emitting diode of Example 1 except that the number of paired layers of the well layer and the barrier layer was 20.

As the result of evaluating the characteristics of the light-emitting diode (light-emitting diode lamp), the response speed (Tr), the light-emission output ($P_O$), and the forward voltage ($V_F$) were respectively 43 nsec, 5 mW, and 1.38 V.

Reference Example 3

A light-emitting diode of Reference Example 3 was manufactured and evaluated under the same conditions as the light-emitting diode of Example 4 except that the number of paired layers of the well layer and the barrier layer was 10.

As the result of evaluating the characteristics of the light-emitting diode (light-emitting diode lamp), the response speed (Tr), the light-emission output ($P_O$), and the forward voltage ($V_F$) were respectively 23 nsec, 6.2 mW, and 1.40 V.

Reference Example 4

A light-emitting diode of Reference Example 4 was manufactured and evaluated under the same conditions as in Example 1 except that the number of paired layers of the well layer and the barrier layer was 20.

As the result of evaluating the characteristics of the light-emitting diode (light-emitting diode lamp), the response speed (Tr), the light-emission output ($P_O$), and the forward voltage ($V_F$) were respectively 36 nsec, 5.2 mW, and 1.51 V.

As will become apparent from the results of Reference Examples 1 to 4, it is understood that, even when the number of paired layers of the well layer and the barrier layer increases, a high light-emission output ($P_O$) is never obtained compared to Examples.

Comparative Example 1

A light-emitting diode of Comparative Example 1 is a comparative example where a compound semiconductor layer is formed using a liquid phase epitaxial method of the related art. Specifically, a light-emitting portion of a double hetero structure having a light-emitting layer made of $Al_{0.01}Ga_{0.99}As$ was epitaxially grown on a GaAs substrate, and a light-emitting diode was manufactured and evaluated.

In manufacturing the light-emitting diode of Comparative Example 1, crystal growth was performed on the GaAs substrate using a slide boat-type growth apparatus.

Specifically, first, a substrate made of n-type GaAs single crystal was set in a substrate storage groove of the slide boat-type growth apparatus, Ga metal, GaAs polycrystal, metal Al, and a dopant were put in a crucible prepared for growing each layer. The layers to be grown had a four-layered structure of a transparent thick-film layer (first p-type layer), a lower clad layer (p-type clad layer), an active layer, and an upper clad layer (n-type clad layer), and were laminated in this order.

Next, the slide boat-type growth apparatus in which these raw materials were set was set in a quartz reactor tube and heated to 950° C. in a hydrogen flow. After the raw materials were molten, the atmosphere temperature fell to 910° C., a slider was pressed right to be brought into contact with the raw materials solution (melt), and the temperature then fell at a rate of 0.5° C./minute. Then, after a predetermined temperature was reached, an operation to press the slider to be brought into contact with the raw materials solution and then to lower the temperature was repeated. Finally, after the slider was brought into contact with the melt, the atmosphere temperature fell to 703° C. to grow an n clad layer, and the slider was pressed to separate the raw materials solution from the wafer. Then, the epitaxial growth ended.

Under the above conditions, the respective layers were grown on a GaAs single crystal substrate of n-type (100) plane by a liquid-phase epitaxial method such that an n-type upper clad layer made of $Al_{0.01}Ga_{0.99}As$ was made to have a thickness of 50 μm, a Si-doped light-emitting layer made of $Al_{0.01}Ga_{0.99}As$ was made to have a thickness of 20 μm, a p-type lower clad layer made of $Al_{0.7}Ga_{0.3}As$ was made to have a thickness of 20 μm, and a p-type thick-film layer made of $Al_{0.25}Ga_{0.75}As$ transparent to the light-emission wavelength was made to have a thickness of 60 μm.

After the epitaxial growth ended, the epitaxial substrate was extracted, and the p-type GaAs substrate was selectively removed by an ammonia-hydrogen peroxide-based etchant while protecting the surface of the n-type GaAlAs clad layer.

Next, gold electrodes were formed on both surfaces of the epitaxial wafer, and a surface electrode with a wire bonding pad having a diameter of 100 μm arranged at the center thereof was formed on the surface of the n-type AlGaAs upper clad layer using an electrode mask having a long side of 350 μm. Ohmic electrodes having a diameter of 20 μm were formed on the rear surface of the p-type AlGaAs thick-film layer at an interval of 80 μm.

After the wafer was cut at an interval of 350 μm by a dicing saw, a fractured layer was removed by etching, whereby the light-emitting diode chip of Comparative Example 1 was manufactured such that the n-type AlGaAs layer becomes the front surface side.

The result of evaluating the characteristics of a light-emitting diode lamp in which the light-emitting diode of Comparative Example 1 is mounted is shown in Table 5.

As shown in Table 5, after a current flows between the n-type and p-type ohmic electrodes of the light-emitting diode of Comparative Example 1, infrared light having a peak wavelength of 940 nm was emitted. The forward voltage (Vf) when a current of 20 milliampere (mA) flowed in the forward direction was about 1.2 volt (V). The light-emission output when the forward current was 20 mA was 2 mW. The response speed (Tr) was 1700 nsec, and in all samples of Comparative Example 1, the high-speed response was inferior to Examples of the invention.

INDUSTRIAL APPLICABILITY

The light-emitting diode of the invention can be used as a light-emitting diode, a light-emitting diode lamp, and an illumination device which emit infrared light with both high-speed response and high output performance.

REFERENCE SIGNS LIST

1: LIGHT-EMITTING DIODE,
2: COMPOUND SEMICONDUCTOR LAYER,
3: FUNCTIONAL SUBSTRATE,
3a: VERTICAL SURFACE,
3b: INCLINED SURFACE,
4: n-TYPE OHMIC ELECTRODE (FIRST ELECTRODE),

5: p-TYPE OHMIC ELECTRODE (SECOND ELECTRODE),
7: LIGHT-EMITTING PORTION,
8: ELECTRIC CURRENT DIFFUSION LAYER,
9: LOWER CLAD LAYER (FIRST CLAD LAYER),
10: LOWER GUIDE LAYER,
11: ACTIVE LAYER,
12: UPPER GUIDE LAYER,
13: UPPER CLAD LAYER (SECOND CLAD LAYER),
14: GaAs SUBSTRATE,
15: BUFFER LAYER,
16: CONTACT LAYER,
17: WELL LAYER,
18: BARRIER LAYER,
20: LIGHT-EMITTING DIODE,
21: ELECTRODE,
22: TRANSPARENT CONDUCTIVE FILM,
23: REFLECTING LAYER,
25: BONDING ELECTRODE,
31: FUNCTIONAL SUBSTRATE,
41: LIGHT-EMITTING DIODE LAMP,
42: MOUNTING SUBSTRATE,
43: n ELECTRODE TERMINAL,
44: p ELECTRODE TERMINAL,
45, 46: GOLD WIRE,
47: EPOXY RESIN,
α ANGLE FORMED BETWEEN INCLINED SURFACE AND PLANE PARALLEL TO LIGHT-EMITTING SURFACE,
50: METAL SUBSTRATE,
51: FUNCTIONAL SUBSTRATE,
52: TRANSPARENT CONDUCTIVE FILM,
53: REFLECTING LAYER,
55: FIRST ELECTRODE,
56: CONTACT LAYER,
57: SECOND ELECTRODE.

What is claimed is:

1. A light-emitting diode comprising:
a light-emitting portion which has an active layer of a quantum well structure, in which a well layer made of a compound semiconductor having a composition formula $(In_{X1}Ga_{1-X1})As$ ($0 \leq X1 \leq 1$) and a barrier layer made of a compound semiconductor having a composition formula $(Al_{X2}Ga_{1-X2})As$ ($0.1 \leq X2 \leq 0.3$) are alternately laminated, a first guide layer and a second guide layer sandwiching the active layer, a first clad layer which is formed on a bottom surface of the first guide layer, and a second clad layer which is formed on an upper surface of the second guide layer;
an electric current diffusion layer which is formed on the light-emitting portion; and
a functional substrate which is bonded to the electric current diffusion layer,
wherein the first and second guide layers are made of a compound semiconductor having a composition formula $(Al_{X6}Ga_{1-X6})As$ ($0.2 \leq X6 \leq 0.5$), and X2≤X6,
the first and second clad layers are made of a compound semiconductor having a composition formula $(Al_{X3}Ga_{1-X3})_{Y1}In_{1-Y1}P$ ($0 \leq X3 \leq 1$, $0 \leq Y1 \leq 1$), and
the number of paired layers of the well layer and the barrier layer is equal to or smaller than 5.

2. The light-emitting diode according to claim 1, wherein the total surface area of the active layer in contact with the first clad layer or the second clad layer is 20,000 to 90,000 $\mu m^2$.

3. The light-emitting diode according to claim 1, wherein the In composition X1 of the well layer is $0 \leq X1 \leq 0.3$, and the thickness of the well layer is 3 to 10 nm.

4. The light-emitting diode according to claim 1, wherein the In composition X1 of the well layer is $0.1 \leq X1 \leq 0.3$.

5. The light-emitting diode according to claim 1, wherein the functional substrate is transparent to a light-emission wavelength.

6. The light-emitting diode according to claim 1, wherein the functional substrate is made of GaP, sapphire, or SiC.

7. A light-emitting diode comprising:
a light-emitting portion which has an active layer of a quantum well structure, in which a well layer made of a compound semiconductor having a composition formula $(In_{X1}Ga_{1-X1})As$ ($0 \leq X1 \leq 1$) and a barrier layer made of a compound semiconductor having a composition formula $(Al_{X2}Ga_{1-X2})As$ ($0.1 \leq X2 \leq 0.3$) are alternately laminated, a first guide layer and a second guide layer sandwiching the active layer, a first clad layer which is formed on a bottom surface of the first guide layer, and a second clad layer which is formed on an upper surface of the second guide layer;
an electric current diffusion layer which is formed on the light-emitting portion; and
a functional substrate which includes a reflecting layer arranged to face the light-emitting portion and having reflectance equal to or greater than 90% with respect to a light-emission wavelength, and is bonded to the electric current diffusion layer,
wherein the first and second guide layers are made of a compound semiconductor having a composition formula $(Al_{X6}Ga_{1-X6})As$ ($0.2 \leq X6 \leq 0.5$), and X2<X6,
the first and second clad layers are made of a compound semiconductor having a composition formula $(Al_{X3}Ga_{1-X3})_{Y1}In_{1-Y1}P$ ($0 \leq X3 \leq 1$, $0 < Y1 \leq 1$), and
the number of paired layers of the well layer and the barrier layer is equal to or smaller than 5.

8. The light-emitting diode according to claim 7, wherein the total surface area of the active layer in contract with the first clad layer or the second clad layer is 20,000 to 90,000 $\mu m^2$.

9. The light-emitting diode according to claim 7, wherein the In composition X1 of the well layer is $0 \leq X1 \leq 0.3$, and the thickness of the well layer is 3 to 10 nm.

10. The light-emitting diode according to claim 7, wherein the In composition X1 of the well layer is $0.1 \leq X1 \leq 0.3$.

11. The light-emitting diode according to claim 7, wherein the functional substrate includes a layer which is made of silicon or germanium.

12. The light-emitting diode according to claim 7, wherein the functional substrate includes a metal substrate.

13. The light-emitting diode according to claim 12, wherein the metal substrate has two metal layers or more.

14. The light-emitting diode according to any one of claims 1 and 7, wherein the number of paired layers of the well layer and the barrier layer is equal to or smaller than 3.

15. The light-emitting diode according to any one of claims 1 and 7, wherein the electric current diffusion layer is made of GaP.

16. The light-emitting diode according to any one of claims 1 and 7, wherein the thickness of the electric current diffusion layer is in a range of 0.5 to 20 μm.

17. The light-emitting diode according to any one of claims 1 and 7, wherein the lateral surface of the functional substrate has a vertical surface perpendicular to a principal light extraction surface on a side near the light-emitting portion, and has an inclined surface inwardly inclined with respect to the principal light extraction surface on a side away from the light-emitting portion.

18. The light-emitting diode according to claim 17, wherein the inclined surface includes a rough surface.

19. The light-emitting diode according to claim 17, wherein a first electrode and a second electrode are provided on the principal light extraction surface side of the light-emitting diode.

20. The light-emitting diode according to claim 19, wherein the first electrode and the second electrode are ohmic electrodes.

21. A light-emitting diode lamp comprising the light-emitting diode according to any one of claims 1 and 7.

22. An illumination device comprising at least two of the light-emitting diodes according to any one of claims 1, 7.

* * * * *